United States Patent [19]
Rothweiler et al.

[11] Patent Number: 5,649,051
[45] Date of Patent: Jul. 15, 1997

[54] CONSTANT DATA RATE SPEECH ENCODER FOR LIMITED BANDWIDTH PATH

[76] Inventors: Joseph Harvey Rothweiler, 5167 Ilchester Rd., Ellicott City, Md. 21043; John Charles Carmody, 9425 Dunloggin Rd., Ellicott City, Md. 21042; Srinivas Nandkumar, 10320 Hickory Ridge #834, Columbia, Md. 21044

[21] Appl. No.: 486,130

[22] Filed: Jun. 1, 1995

[51] Int. Cl.$^6$ .................................................... G10L 9/00
[52] U.S. Cl. ................................. 395/2.31; 395/2.32
[58] Field of Search .................... 395/2.09, 2.1, 395/2.14, 2.15, 2.16, 2.29, 2.3, 2.31, 2.32; 381/36, 37–42, 49, 50

[56] References Cited

U.S. PATENT DOCUMENTS

| Re. 34,247 | 5/1993 | Atal et al. | 395/2.12 |
|---|---|---|---|
| 4,706,260 | 11/1987 | Fedele et al. | 375/27 |
| 4,718,087 | 1/1988 | Pamamichalis | 395/2.32 |
| 4,899,385 | 2/1990 | Ketchum et al. | 395/2.32 |
| 4,963,030 | 10/1990 | Makur | 395/2.31 |
| 5,233,660 | 8/1993 | Chen | 395/2.31 |
| 5,307,441 | 4/1994 | Tzeng | 395/2.31 |
| 5,353,373 | 10/1994 | Drogo de Iacovo et al. | 395/2.32 |
| 5,384,891 | 1/1995 | Asakawa et al. | 395/2.29 |
| 5,481,642 | 1/1996 | Shoham | 395/2.28 |

OTHER PUBLICATIONS

Final Report for Contract F30602–89–C–0118 entitled, "Improved Speech Compression Algorithm".

*Primary Examiner*—Benedict V. Safourek
*Assistant Examiner*—Ricky Q. Ngo
*Attorney, Agent, or Firm*—W. H. Meise; D. W. Gomes; S. A. Young

[57] ABSTRACT

A speech signal has its characteristics extracted and encoded (16), transmitted over a limited-data-rate path (18) and is decoded (20) and synthesized (22) at the receiving end. The characteristics include line spectral frequencies (LSF), pitch and jitter. The LSF are extracted by autoregression, and split-vector quantized (SVQ) in a single frame, and, in parallel, in blocks of two, three and four frames. The SVQ codes have equal length and are evaluated for distortion in conjunction with a threshold. The threshold is varied in such a manner as tend to select for transmission those codewords which maintain a constant data rate into a transmit buffer. A single-bit jitter bit, and encoded pitch value, are product coded with the selected LSF codeword, and all are transmitted over the data path (18) to the receiver. The receiver decodes the characteristics, and controls a pitch generated (1226) in response to the pitch value and a random pitch jitter in response to the jitter bit. Two sets of line spectrum filters receive random noise and the pitch signal, respectively. The filtered signals are modulated by multipliers (1222, 1230) controlled by the LSF codes, and the filtered signals are summed and applied to a final LSF-controlled filter.

17 Claims, 15 Drawing Sheets

| CODEBOOK ENTRY | C | | | | |
|---|---|---|---|---|---|
| 0 | 1.0 | 1.1 | 1.2 | 1.4 | 1.9 |
| 1 | 0.8 | 1.1 | 1.21 | 1.47 | 1.6 |
| 2 | 2.1 | 2.3 | 2.7 | 2.75 | 2.9 |
| 3 | 0.4 | 1.23 | 1.25 | 1.3 | 1.4 |
| N−1 | 0.5 | 0.6 | 0.8 | 1.0 | 1.1 |
| N | 1.40 | 1.45 | 1.5 | 1.6 | 1.8 |

| ENTRY | D | | |
|---|---|---|---|
| 0 | 1.02 | 1.04 | 1.7 |
| 1 | 1.2 | 1.27 | 1.65 |
| 2 | 2.1 | 2.17 | 2.2 |
| 3 | 0.8 | 0.82 | 0.97 |
| 4 | 2.0 | 2.3 | 2.4 |
| 5 | 0.25 | 0.38 | 0.92 |
| N−1 | 1.8 | 1.85 | 1.9 |
| N | 1.4 | 1.9 | 2.3 |

FIG. 4d

NOTCHED FILTER TRANSITION WEIGHTING FOR P.E.D.

CORRELATION FOR MIXTURE ESTIMATION

CONSTANT DATA RATE SPEECH ENCODER FOR LIMITED BANDWIDTH PATH

FIELD OF THE INVENTION

This invention relates to encoding for transmission of information, and more specifically speech or speech-like signals, over limited-bandwidth transmission systems.

BACKGROUND OF THE INVENTION

Low data rate speech communications find use in vehicular systems, secure-communication systems, and the like. A prior-art system is the Federal Standard 1015 Linear Predictive Coding (LPC) algorithm. This LPC algorithm transmits speech at 2400 bits per second. When, as in an aircraft, the speech is likely to be accompanied by noise, or when the vocabulary is not limited, such prior-art systems may not produce understandable speech at the receiving end. Even when the vocabulary is fixed, and noise is not a problem, some such prior-art systems reproduce the speech in an artificial-sounding manner, which does not preserve the attributes of the speaker's voice, and does not allow the speaker to be recognized by voice alone. Also, those prior-art systems which use tree-type octave-band filter banks, such as that system described in "Improved Speech Compression Algorithms: Final Report on Contract F30602-89-C0118," improve the intelligibility of speech in noise. However, the octave-band filter structure introduces additional delay, which makes two-way conversations more difficult, and it adds processing complexity. Further, the octave-band filters restrict the choice of bands to be used.

In some prior art systems, the excitation signal transmitted through the low-data-rate path is characterized by a single speech parameter, namely the average pitch, which corresponds to the rate at which the speaker's vocal folds are vibrating. The average pitch parameter can be specified either as a frequency, or as a time interval between closures of the vocal folds. It is well known that there are other, more subtle features which contribute to the unique character of an individual's voice, including the jitter (short-term variation in the pitch period), and shimmer (period-to-period variation in the power of the excitation). However, complexity has prevented their reproduction in prior-art systems. In some prior art systems, the pulse sequence that is used to excite the speech synthesizer at the receive end of the system is assumed to vary slowly. The pitch as measured in the transmitter often exhibits doubling or halving of the value from one frame to the next. These observed changes may be due to either actual doubling or halving of the speaker's pitch, or to tracking errors in the pitch tracker; in general, it is difficult to distinguish these two sources.

Prior-art speech encoders often represent the speech in a frame as a set or vector of a plurality of digital numbers representing line spectrum frequencies, such as ten digital numbers, each representing the frequency of one spectral line. The assumption is made that the particular number of spectral lines which is selected is sufficient to represent the speech within the frame, to the desired level of accuracy. In such an arrangement, the number of bits in the resulting vector equals the number of bits per digital number, times the number of digital numbers in the vector. For example, if each digital number were to be quantized to three bits, thirty total bits would be required to represent a 10-number vector representing one frame of speech, and if five-bit coding were used, fifty total bits would be required. These bits must eventually be transmitted to a remote receiver over the limited-bandwidth data path, so it is important to minimize the total number of bits required for the representation.

In prior-art vector quantization (VQ), a fixed codebook or library of vectors is established, which is intended to include approximations of all vectors which are likely to be encountered in speech. The line spectrum vector of the speech to be transmitted is compared with the library vectors to find the best match. Instead of transmitting the line spectrum vector itself over the data path, an index or codeword is transmitted which identifies the particular one of the library vectors which is the closest match. The index accesses a corresponding library vector at the receiver. High-quality speech reproduction which is independent of vocabulary and of speaker requires $2^{22}$ vectors, which is about four million vectors. This number of vectors is so large that significant processing time is required for the comparison using currently available technology, and a substantial amount of memory is required at both the transmitter and at the receiver for vector storage.

Another type of quantization which has been described in the prior art for reduction of the data rate, in place of scalar quantization, is split vector quantization (split-VQ). In split-VQ, the line spectrum vector is split into plural portions, such as two portions, each of which is independently quantized using a separate codebook. In the abovementioned 10-number example, the vector might be broken into two portions, a six-number portion and a four-number portion, each of which is quantized using a codebook of $2^{12}$ vectors, corresponding to 4096 vectors. The size of the codebook is based upon experimental results reported in the literature. Using 4096 vectors in a codebook, for example, split-VQ uses 24 bits, which is a greater number of bits than ordinary VQ, but split-VQ is more practical.

Some prior-art speech encoding systems for low data rate transmission further reduce the data rate by taking advantage of the relatively small changes in the speech from frame to frame. This is accomplished by transmitting only a subset of the frames, and by interpolating the missing frames at the receiver. This technique is known as "frame interpolation". Clearly, frame interpolation cannot work properly when its underlying assumption of slowly varying speech is not in fact the case. More particularly, for vowel sounds, the spectrum of the signal changes vary slowly, so the speech content of the frames of the block will be very similar. As a result, the distortion due to frame interpolation will be low. For many consonants, however, the spectrum is changing rapidly so that three successive frames are widely different, and frame interpolation is less efficient. Even when speech does in fact change slowly, frame interpolation does not provide more than about a 50% data rate reduction.

An improved speech encoder is desired.

SUMMARY OF THE INVENTION

A speech encoder according to the invention uses vector quantizers to quantize the speech spectral information into codewords which represent various spectral envelopes. A first vector quantizer quantizes the spectral information relating to one frame of speech into a codeword having a particular number of bits, and other spectral quantizers quantize into similar codewords the spectral information relating to pluralities of frames taken as a unit. For example, a second vector quantizer may quantize the spectral information of two frames to generate a codeword having the same number of bits as the one-frame codeword, a third vector quantizer may quantize the spectral information of three frames taken as a unit, to produce a codeword having the same number of bits, and so forth. The codewords are buffered, and transmitted over a limited-data-rate signal path. One of the codewords is selected from among the currently available set of codewords for transmission. The selection is performed by evaluating the relative distance or distortion between each codeword and another codeword-plus-threshold, with the least distance being preferred. The buffer is prevented from overflowing or from becoming empty, which might cause the associated modems from properly synchronizing, by adjusting the magnitude of the threshold in response to the buffer input data rate. In a particular embodiment of the invention, a single-frame block, and two-, three-, and four-frame blocks are split-block vector coded.

According to another aspect of the invention, a method for direct differential coding of temporally related digital signals, includes the steps of providing memorized values identified by codewords. The signal to be direct differential coded is temporally divided into nonoverlapping blocks. The difference is taken between a selected one of the signals in one of the blocks and the remaining signals in the block, to generate difference signals for that block. The difference signals and the selected one signal in each of the blocks are individually compared with the memorized values. As a result of the comparison, each of the difference signals is assigned a codeword, and the selected one signal is assigned a codeword, which represents that one of the memorized signals which is the closest match to the difference signal or the selected one signal. The codewords produced for the block of signals are combined by product coding. In one embodiment of the invention, the product coding is simply concatenation of the codewords.

DESCRIPTION OF THE DRAWING

FIG. 4d illustrates simplified codebooks which may be used in the arrangement of FIG. 4a;

FIG. 10 is a simplified block diagram of the correlator of FIG. 2a;

FIG. 11 is a simplified flow chart illustrating the determination of voicing by periodicity analysis in the arrangement of FIG. 2a.

DESCRIPTION OF THE INVENTION

Figure 1:
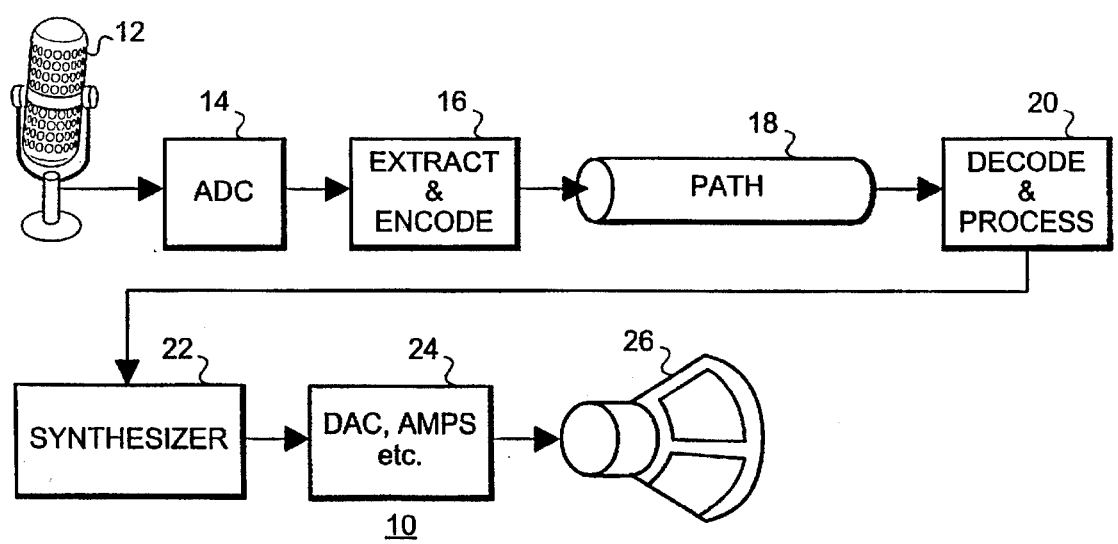
FIG. 1 is a simplified block diagram of a transmitter and a receiver for transmitting signals over a signal transmission path having a limited bandwidth or data rate according to an embodiment of the invention.

For an application according to the invention, two-way split vector quantization (VQ) has been found to be a good compromise between codebook size and quantization distortion. For a single-frame quantizer using split-VQ, the coding procedure includes several steps. First, that vector is found in a codebook C which most nearly matches vector A. A distance or distortion measure $d_k$ is then determined $$d_k = \sum_{i=0}^{B} c_i W_i (A_i - C_{k,i})^2 \qquad (1)$$

where the subscript k represents the vector in the codebook; running variable i represents the element of the vector;

$c_i$ is an empirically determined weighting factor equal to 1, $1 \leq i \leq 8$; equal to 0.8, i=9; and equal to 0.4 otherwise;

$W_i$ is a weight based on the power of the speech frame being quantized; and $C_{k,i}$ is the stored codeword.

The vector in codebook C for which the distance $d_K$ to input speech vector A is minimum is selected as being the closest match, and the index, k, of that vector is selected as the codeword to be transmitted.

Similarly, a codebook D is searched, using the same equation (1), to find the best match to vector B, and its index is transmitted. The only difference between codebooks C and D is that the C codebook includes elements which are compared with the first or lower-frequency spectral lines of the input speech vector, and codebook D includes elements which are compared with the remainder of the spectral lines of the input speech vector. This, in turn, imposes a requirement that the line spectral frequencies of the C and D codebooks must be ordered. That is, $f_i > f_{i-1}$, i–1, . . . , 13. This means that the line spectral frequencies represented by the combination of the codewords from the C and D codebooks constitute a monotonically increasing sequence, and means that $f_i$ is the highest frequency. To maintain this condition, only certain vectors in the D codebook are searched, namely those for which the first element is greater than the last element of the selected vector from codebook C. For example, if the last entry of the vector selected in codebook C is denoted by $f_m$, then the lowest permitted search frequency in codebook D begins at frequency $f_h$, where $f_h > f_m$. A more explicit example is provided in the idealized split codebook structure of FIG. 4d, in which portions of simplified C and D codebooks are illustrated. The input speech vector is assumed to consist of eight elements. Each codebook includes a plurality of rows, designated entries. Each codebook entry is represented by numbers or elements in a plurality of columns, where the C codebook has a representative number of five columns, and the D codebook has three columns. The five elements of the entries of the C codebook must be compared with the first five elements of the eight-element input speech vector, and each D codebook entry has three numbers which must be compared with the last three elements of the input speech vector. In this way, all eight elements of the input speech vector are compared with codebook entries, but not all the D codebook entries are required to be among those for which a comparison is performed. The reduction in the number of entries which must be compared with the input speech vector, in turn, reduces the number of processing operations, and therefore reduces the processing time.

Each row of an entry in each codebook of FIG. 4d represents a monotonically increasing sequence of line spectral frequencies. When a particular entry of codebook C, for example entry 0 of codebook C, is selected as the one which is the closest match to the input speech vector, the number of entries in codebook D which must be searched is reduced. More particularly, only those entries of codebook D whose first element or frequency is higher than 1.9 (in this example) must be searched. In this case, only entries 2 and 4 of codebook D must be compared with the input speech vector, because only those two entries have first column frequencies which exceed 1.9. This, as mentioned, reduces the search time. The transmission of information relating to the input speech vector is accomplished by transmitting the codebook entries (C,D), which in this example is one of the vector sets (0,2) or (0,4). In an actual embodiment of the invention, the input speech vector had fourteen elements, and codebooks C and D contained six and eight elements or columns, respectively.

According to an aspect of the invention, the data rate is further reduced by (a) split-block vector quantization (SBVQ), in which multiple frames are quantized as a unit or block, and/or (b) by dynamically optimizing the size of the block. The dynamic adjustment of block size is accomplished, for example, by selecting a block length of n=3 frames when the speech spectrum is changing slowly, and by changing to n=1 (ordinary split-VQ) when the speech spectrum is changing rapidly.

According to the split-block vector quantization (SBVQ) aspect of the invention, a group of n input speech frames is quantized as a unit or block, where n ranges from two to four. In the earlier specific example, the input speech vector had eight elements in a single frame, five of which were encoded using codebook C, and three using codebook D. In SBVQ, n input speech frames have eight times n elements in a single block, five times n are encoded using a codebook C', and three times n are encoded using a codebook D'. It was discovered that, for equivalent output speech quality, the number of vectors in an SBVQ codebook needs to be only slightly larger than the number of vectors in a split-VQ codebook. Thus, it requires searching only a slightly larger number of codebook entries to transmit n frames by comparison with one frame. Since the number of vectors which must be transmitted per unit time is reduced with SBVQ, as a result of the encoding of several frames at a time, an improved or lower data transmission rate results. For example, in a case in which split-VQ transmits 24 bits per frame, which, with frame interpolation, averages 12 bits per frame, SBVQ with n=3, and with two 13-bit codebooks, transmits equivalent speech quality at 26 bits for three frames, which corresponds to about 8.67 bits/frame, and accomplishes this result without recourse to frame interpolation.

It was discovered that, when the comparison of the actual input speech vectors with the codebook vectors was based upon the total distance between each of the input vectors and the corresponding vector of the codebook, an undesirable rough quality was imparted to the speech, with some severe distortion. According to a further aspect of the invention, improved speech quality, resulting from comparison of the actual line spectrum vector with the vectors of the codebook to select the best match, is achieved by weighting some of the input speech vectors more than others. This simply means that more importance is attached to some of the input sounds than to others.

For a single frame quantizer using VQ, assume that the input signal consists of a plurality, for example 14, of line spectral frequencies $f_i$, i=0, ..., 13. This set of frequencies might be divided into a pair of vectors (split-VQ), of lengths 6 and 8: $A_i=f_i$, i=0, ..., 5, and $B_i=f_i+6$, i=0, ..., 7. According to the weighting aspect of the invention, a set of a plurality (14 in the example) of weights $W_i$ is computed, which are a function of the $f_i$'s. The computation of $W_i$ is described in the paper entitled, "Efficient Vector Quantization of LPC Parameters at 24 Bits/Frame", by K. K. Paliwal et al., published in the IEEE Transactions on Speech and Audio Processing, Vol 1, page 3. A codebook C, which typically contains 4096 sets of A vectors, and another codebook D, which typically contains 4096 sets of B vectors, is provided for such a single frame quantizer. The same number of vectors is provided in each set in order to maintain high fidelity or transparency.

In the simplest embodiment of the split-block VQ (SBVQ) aspect of the invention, a block of three frames is coded as a unit. For example, suppose we represent the frequencies for three frames as $f_{j,k}$, j=0, ..., 2, k=0, ..., 13, where j represents the frame number, and k represents the element number.

A vector A is generated from the first 6 components of each frame $$A_{\theta j+k}=f_{j,k}, j=0, \ldots, 2, k=0, \ldots, 5 \qquad (2)$$

where the subscript $\theta$ designates that equation (2) relates only to the first six elements of the input speech vector.

A distance or distortion measure is determined $$d_k = \sum_{j=0}^{2} E_i \sum_{i=0}^{3} c_i W_{\theta j+i}(A_{\theta j+1} - C_{k,\theta j+1})^2 \qquad (3)$$

in which a weighting term $E_i$ is used. It has been found that some frames are more important than others when quantizing multiple frames. For example, the beginning of a word may have two frames representing silence, followed by a third frame containing speech. In such cases, the quality of the output speech can be improved by increasing $E_2$, thereby attaching more importance to the third frame. In the preferred embodiment, $E_i$ is set equal to the energy value or signal power computed over one-half of the frame interval.

FIG. 1 is a simplified block diagram of a system 10 in accordance with the invention. In FIG. 1, a source of speech signals is illustrated as a microphone 12. Speech signals from source 12 are coupled to an analog-to-digital converter (ADC or A/D) 14, for being converted into digital signals. The sampling rate of the signals in ADC 14 will depend upon the bandwidth of the signals being quantized, and upon the bandwidth of the transmission path through which the signals are ultimately transmitted, but for the case of speech to be transmitted at about 1000 bits-per-second (bps), the ADC operates at about 10 Khz. The digitized signals from ADC 14 are coupled to a speech characteristic extractor and encoder, illustrated together as a block 16. Characteristic extractor and encoder 16 processes the signals as described in more detail below, and applies the encoded signals to a limited-bandwidth, limited data rate, or limited bit-rate path, illustrated as 18. In the preferred embodiment, path 18 has a bit rate capacity of about 1000 bps. Those skilled in the art recognize that path 18 may include modulators, demodulators, antennas, optical fibers, converters, repeaters, and other coding, decoding and processing arrangements, (not illustrated) which are not material to the invention. The encoded signals at the output end of the transmission path 18 of FIG. 1 are applied to a decoder and processor, illustrated together as a block 20. The decoded and processed signals from block 20 are applied to a speech synthesizer illustrated as a block 22, which reconstructs a likeness of the original speech signals. The resulting speech-representative signals are applied through a digital-to-analog converter (DAC), amplifiers or other processors, illustrated together as a block 24, to a sound reproducer, illustrated as a loudspeaker 26.

Figure 2A:
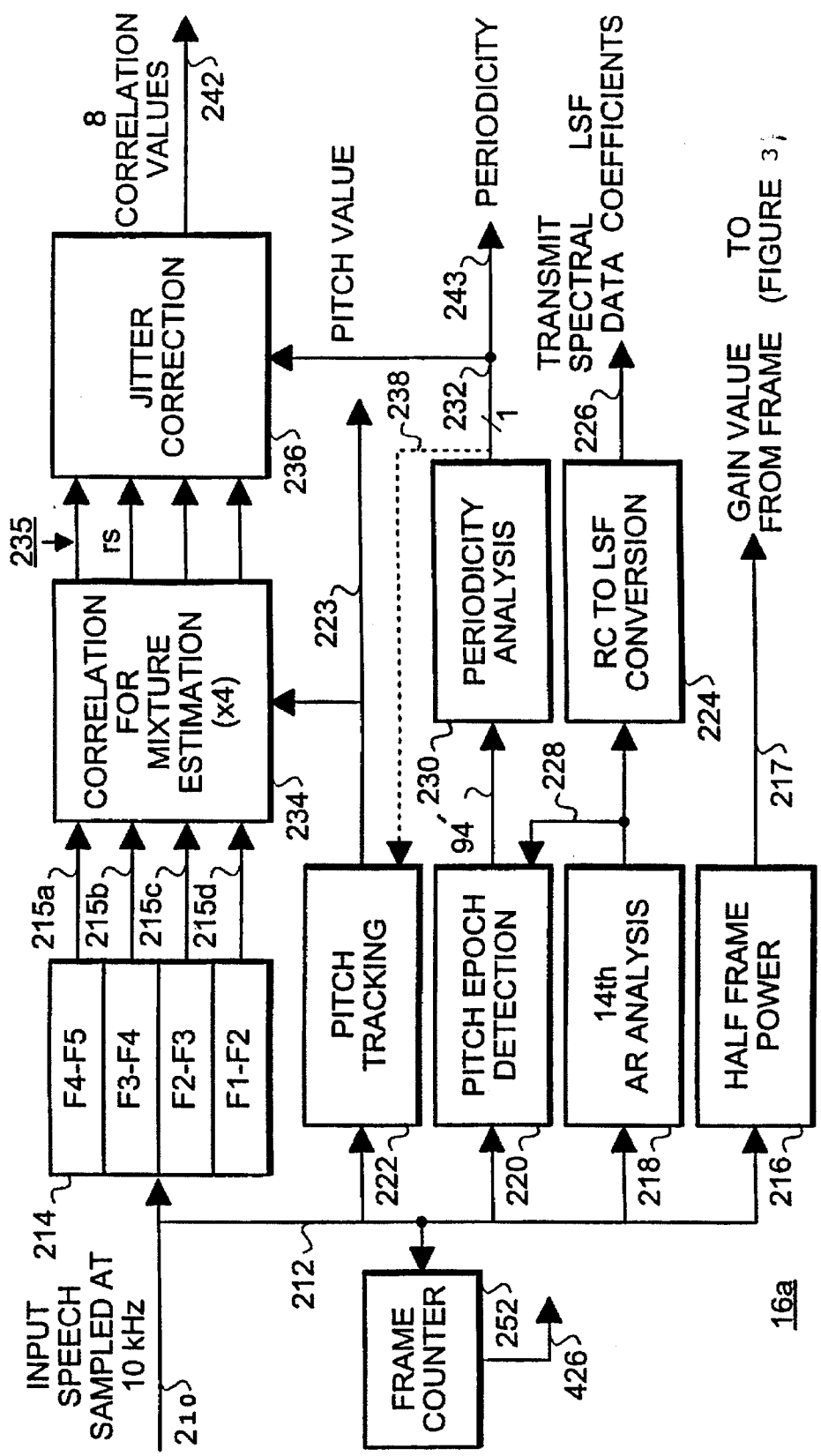
FIG. 2a is a simplified block diagram of a parameter extractor portion of the extractor and coding block of the arrangement of FIG. 1.

FIG. 2a is a simplified block diagram of the parameter extraction portion 16a of extractor and coding block 16 of FIG. 1. In FIG. 2a, the digitized information signal, which, as mentioned, may be sampled at 10 Khz., is applied to an input port 210, and is coupled by a path 212 to the inputs of: a filter bank, illustrated as a block 214; a half-frame power analyzer 216; an autoregression analyzer 218; a pitch epoch detector 220; and a pitch tracking block 222, all of which are known in the art. The digitized information signal is also applied to a frame counter 252, which establishes a frame count, and makes it available on a signal path 426 for the remainder of system 10.

In some prior art arrangements, the speech power is computed over a full frame (about 15 to 25 msec). The invention uses half-frame determination of power for improved time resolution. This improved time resolution is especially important to consonant sounds, because they involve rapid changes in the speech power level. Half frame power determining block 216 of FIG. 2a determines the signal power, or more properly the amount of power represented by the information signal, over one-half of a predetermined frame interval. For a particular embodiment in which the transmission path is required to have a data rate no greater than about 1000 bits per second, and in which the sample rate of the incoming information signal is 10 Khz., the frame interval may be 22.5 milliseconds (msec). With these system values, there are 225 samples per frame. The power is determined for at least the first half of the frame, by determining the root-mean-square of the value represented by the signal. In a preferred embodiment of the invention, the power is determined independently for each half of each frame interval. The signals representative of the signal power per half-frame are applied from half-frame power determining block 216 to a signal path 217, from which they are coupled to a coder 216 of FIG. 2b, as described in more detail below.

Autoregression analysis block 218 of FIG. 2a represents an autoregressive model analyzer, which produces signals representative of the frequency spectrum of the information or speech signals. More particularly, block 218 produces a set of 14 numbers which represent the key features of the shape of the input speech signal spectrum. The particular autoregressive model analyzer used in the embodiment of the invention was of fourteenth order, but it is believed that as little as tenth order may be used when the information signals are accompanied by little noise. The autoregression is a standard technique. The particular version of autoregression used in the embodiment of the invention was the Modified Covariance method described in "Modern Spectral Estimation: Theory and Application", by Steven M. Kay, published by Prentice-Hall, 1988, Section 7.5, entitled "Modified Covariance Method", pp 225–228.

The signals produced by fourteenth-order autoregression (AR) block 218 of FIG. 2a represent the frequency spectrum of the input signal. These signals are applied by a path 228 to a pitch epoch detector 220, described in more detail below in conjunction with FIG. 8, and to a line spectral frequency (LSF) converter, illustrated as a block 224. Block 224 converts the reflection coefficient (RC) representation produced by autoregression block 218 into a line spectral frequency (LSF) representation, using a standard technique, such as that described in the article "Computation of Line Spectral Frequencies", by Kabal and Ramachandran, published at pp 1419–1426 in the IEEE Transactions on Acoustics, Speech, and Signal Processing, Volume 34, No. 6, Dec., 1986. The line spectral frequency coefficient representation is applied from block 224 by way of a signal path 226 to a split-band vector quantizer 410 of FIG. 2b, described in more detail below.

Pitch epoch detector block 220 of FIG. 2a represents an analyzer which determines length of each pitch period in the input speech signal. In general, the epoch detection is accomplished in block 220 of FIG. 2a by an extension of a method described in the article "Automatic and Reliable Estimation of Glottal Closure Instant and Period", by Cheng and O'Shaughnessy, published at pp 1805–1815 in the IEEE Transactions on Acoustics, Speech, and Signal Processing, Volume 37, No. 12, Dec., 1987, in which a matched filter, Hilbert transformer, and selection logic is used. A first function of pitch epoch detector 220 estimates the vocal tract impulse response by autoregression. A second function of pitch epoch detector block 220 is matched filtering of the speech, which is performed by applying the time-reversed impulse response from the first function as coefficients to a Finite Impulse Response (FIR) filter, and applying the FIR filter to the speech. This filtering emphasizes those portions of the speech in which pitch pulses are present. The third function of block 220 is determination of the envelope of the filtered signal. In the particular embodiment of the invention, this determination is accomplished by use of an energy operator different from that used by Cheng and O'Shaughnessy. This different energy operator is simpler than that of Cheng and O'Shaunessey, and provides corresponding accuracy. A fourth function of block 220 is determination of the time location of the peak of the envelope. A fifth function of block 220 is determination of a minimum peak amplitude threshold to be applied to the peak found in the fourth function. If the peak found in the fourth function is above the threshold, it is declared to be a pitch epoch, whereas the peak is ignored if it lies below the threshold. The pitch epoch signals are coupled by a path 94' to a block 230, which represents periodicity analysis.

Figure 8:
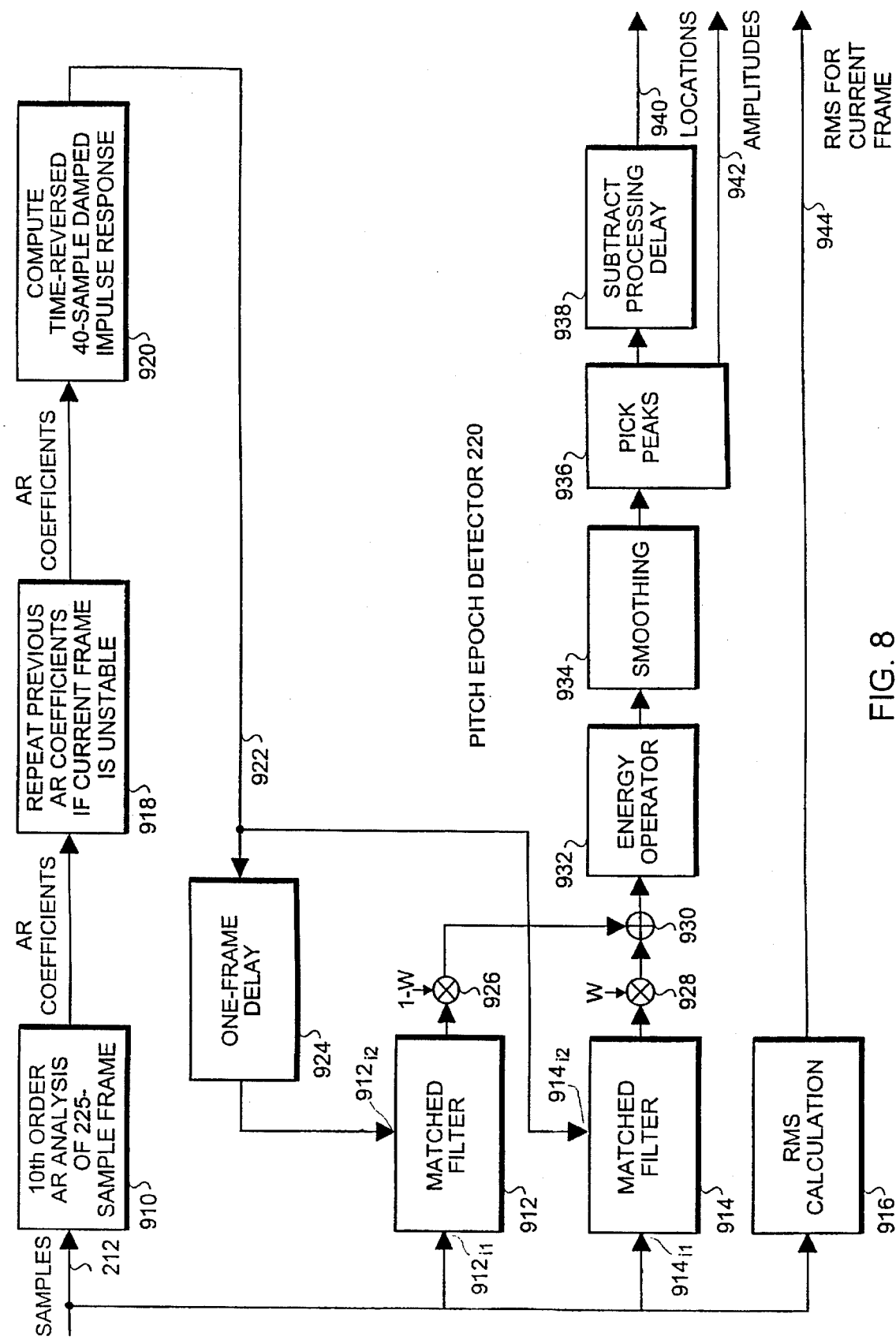
FIG. 8 is a simplified block diagram of the pitch epoch detector of FIG. 2a, and FIG. 9 is a plot illustrating weighting signals for weighting signals in the epoch detector of FIG. 8.
Figures 9, 10:
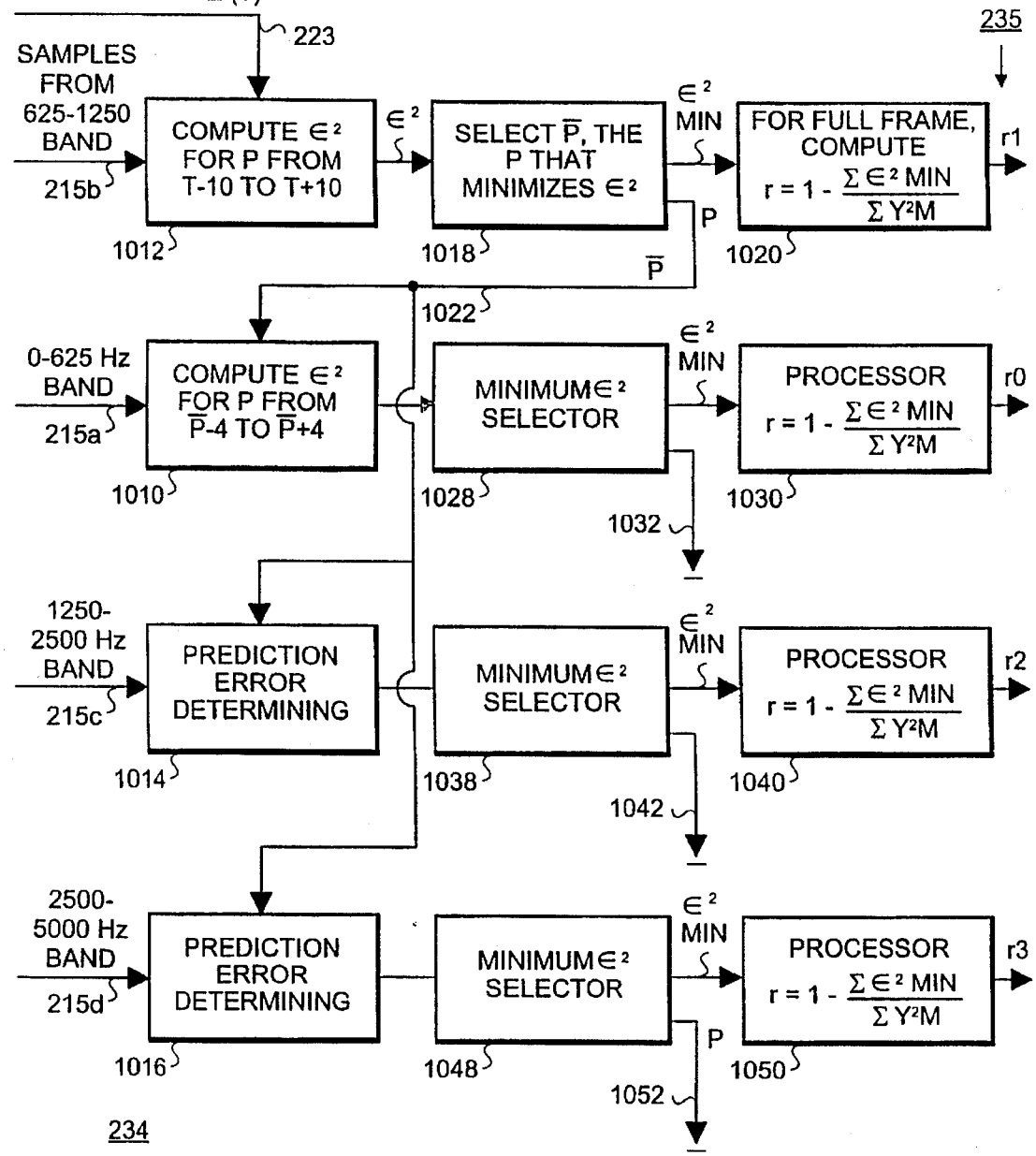

FIG. 8 is a simplified block diagram of pitch epoch detection block 220 of FIG. 2a. In FIG. 8, the input speech signals are applied over a signal path 212 to a 10th order autoregressive analyzer 910, to first input ports $912_{i1}$, $914_{i1}$ of a pair of matched filters or correlators 912 and 914, and to a root-mean-square (RMS) power calculator 916. AR analyzer 910 calculates ten inverse coefficients for a 225-sample frame of the input speech signal, using the modified covariance approach described in conjunction with block 218. If the resulting coefficients are stable, meaning that they all have values less than unity, they pass through a block 918 unchanged, and are applied to a block 920. If they are unstable, the coefficients from the next previous stable frame are substituted by block 918. The coefficients emerging from block 918 are applied to a block 920, which represents computation of a time-reversed forty-sample damped impulse response, known in the art, which defines the temporal locations of the pitch pulses. From block 920, the locations and amplitudes of the pitch pulses are applied over a path 922 to a second input port $914_{i2}$ of matched filter 914, and, by way of a one-frame delay 924, to a second input port $912_{i2}$ of matched filter or correlator 912. Matched filters 912 and 914 compare the input speech signal with the damped impulse response of the current and previous frames, to indicate the amplitudes and locations of the pitch pulses. The outputs of matched filters 912 and 914 are applied to multipliers 926 and 928, respectively, for multiplication by weights 1-W and W, respectively. FIG. 9 illustrates the weighting by a plot 925. Plot 925 of FIG. 9 increases linearly with sample within the frame from a value of 0 for the zeroth sample, to unity at sample 40, and remains at unity for all samples greater than 40. This weighting makes a smooth transition between the output of matched filter 912 and the output of matched filter 914, which in turn results in a smooth transition between the previous-frame impulse response and the current-frame impulse response in the following adder. The two weighted signals from multipliers 926 and 928 of FIG. 8 are summed in an adder 930, which produces a signal which represents the amplitudes and locations of pitch pulses in the current and previous frames. Thus, if the pitch pulses in the input speech are regular in both the current and in the previous frames, one or more correlation peaks will occur in the signals from adder 930.

In FIG. 8, the correlation peak(s) from adder 930 is applied to an energy operator illustrated as a block 932, which replaces the Hilbert transformation of the prior art. Energy operator 932 determines the locations and the amplitudes of the correlation peaks, as described in an article entitled "On a simple Algorithm to Calculate the Energy of a signal," by James F. Kaiser, which appeared at pp 381–384 of ICASSP-90, IEEE Proceedings of the International Conference on Acoustics, Speech & Signal Processing, and applies the signals to a further block 934. Block 934 represents filtering or smoothing of the correlation information, to produce an envelope. The envelope information is applied to a block 936, which determines the locations and amplitudes of the peaks of the envelope signal. The amplitude information is coupled out over a signal path 942, and the location information is applied to a further block 938. Block 938 adjusts for processing delay, to bring the location information into synchronism with the spectral data of the speech signal. The time-corrected signal is applied from block 938 to a signal path 940.

The speech signals applied to RMS block 916 of FIG. 8 are processed, and a signal representative of the speech energy in the current frame is applied to output signal path 944. Signal paths 938, 940, and 944 are designated together as 94' in FIG. 2a.

Periodicity analysis block 230 of FIG. 2a, in general, computes an estimate of the pitch jitter (computed as the standard deviation of the pitch periods for all pitch epochs in the current frame). If this value is greater than 25% of the average pitch for the current frame, a signal or flag is generated to mark the frame as having aperiodic excitation or jitter. Block 230 receives pitch location, pitch pulse amplitude, and average signal power signals over signal paths 940, 942, and 944, respectively, of signal path 94' in FIG. 2a, and generates a one-bit signal on signal paths 232 and 243, which indicates the periodic (non-jitter) or aperiodic (jitter) nature of the pitch pulses.

Figure 11:
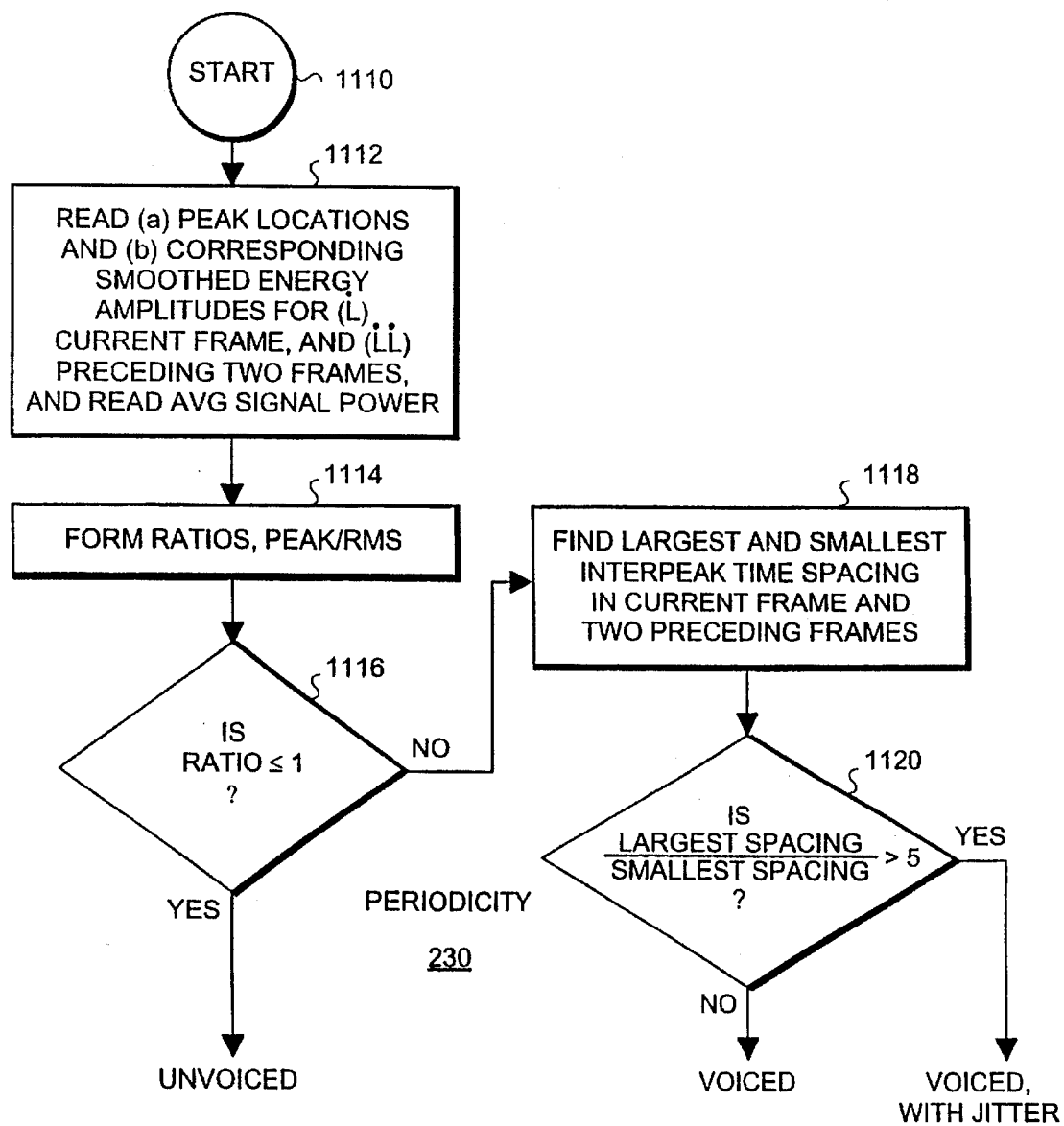

FIG. 11 is a simplified flow chart of the processing performed by periodicity analysis block 230 of FIG. 2a. In FIG. 11, the logic starts at a START block 1110, and flows to a block 1112, which represents reading of the pitch location and amplitude, and of the average signal power. Block 1114 represents formation of the ratio between the amplitude of each of the peaks and the average signal power. The logic then flows to a decision block 1116, in which the ratio is compared with unity. If the ratio is not greater than unity, the logic leaves decision block 1116 by the YES path, thereby indicating that the speech is unvoiced. If the ratio is greater than unity or equal to unity, the logic leaves decision block 1116 by the NO path, and arrives at a block 1118, which represents determination of the largest and smallest pitch pulse intervals or spacings for both the current frame and the two preceding frames. Decision block 1120 directs the logic to the NO output if the ratio of the largest spacing divided by the smallest spacing is greater than a constant, which is taken as 1.5. The NO output of decision block 1120 represents a voiced signal, without jitter. If, on the other hand, the ratio determined by block 1118 has a largest/smallest spacing less than or equal to 1.5, the logic flows to the YES output, indicating voiced, with jitter. The one-bit output signal produced by block 230 of FIG. 2a has a first state which is the combination of voiced without jitter and unvoiced, which by definition has no jitter. The other state of the one-bit signal represents voiced, with jitter.

In a preferred embodiment implementation for use at 1000 bps, a 1-bit signal is sent from periodicity analysis block 230 of FIG. 2a to the receiver 20 (of FIG. 1), to indicate the presence of aperiodicity. A corresponding jitter is then added to the pitch pulses, as described below. Signal path 243 of FIG. 2a carries the one-bit periodicity signal.

Pitch tracking block 222 of FIG. 2a receives the digitized information signals, and determines the average pitch of the signal, or more properly, the average pitch which the signal represents. This determination is made over the predetermined frame interval. In this particular embodiment, the pitch tracking was performed by a standard software pitch tracking module, taken from the Department of Defense (DoD) LPC-52 voice coding system, converted to operate at the desired sampling rate. Another way to determine the average pitch is to average the pitch intervals produced by the periodicity analysis module 230, received by way of dash line 238. The pitch-representative information is coupled from pitch tracking block 222 onto an output signal path 223.

Filter bank 214 of FIG. 2a separates the received speech information signals into a plurality of frequency bands by the use of a plurality of paralleled (rather than tree, as in the prior art) filters. In the arrangement of FIG. 2a, four filters are used, for nonoverlapping frequency bands F1–F2, F2–F3, F3–F4, and F4–F5. According to an aspect of the invention, as used in an embodiment of the invention, frequency F1–F2 is zero-frequency to 625 Hz., F2–F3 is 625–1250 Hz, F3–F4 is 1250–2500 Hz., and F4–F5 is 2500–5000 Hz. These frequencies are determined by empirical means, and have been found to be more effective in producing good fidelity than other frequency bands which have been evaluated. The octave-band filters are those in the range 625–2500 Hz. These filters separate the signals in such a fashion that the four bands, when added together or superposed, exactly reproduce the input signal, except for a time delay.

The four filtered bands at the output of filter bank 214 of FIG. 2a are applied over signal paths 215a, 215b, 215c, and 215d to a block 234, which represents correlation of the filtered signals with signals representing a time increment equal to the estimated pitch interval. The time increment signals are coupled to block 234 over signal path 223. Correlation block 234 produces an estimate or measure of the degree of voicing (c) in each band. The estimation of the voicing is identical to that of "Improved Speech Compression Algorithms: Final Report on Contract F30602-89-C0118."

FIG. 10 is a simplified block diagram of correlator 234 of FIG. 2a. In FIG. 10, the speech signal samples from the 0–625 Hz. band are applied over signal path 215a to an prediction error determining block 1010, the speech signal samples for the band 625–1250 Hz. are applied over path 215b to an prediction error determining block 1012, and the other two bands are applied over paths 215c and 215d to equivalent blocks 1014 and 1016, respectively.

Block 1012 of FIG. 10 receives the pitch estimate signal over signal path 223, and generates prediction error power $\epsilon^2$ for each value of P, where P is the estimated pitch interval, measured by the number of samples in each pitch interval. Block 1012 performs this in accordance with equation 10, derived as follows.

For this embodiment, let $Y_i$ be the set of samples of output from the bandpass filter along signal path 215b, where i indicates time sequence. Further, let $x_i$ be the set of samples of output from the bandpass filter along the signal path 215b, at times i–P so that $x_i$ and $Y_i$ are relatively delayed samples; that is $$x_i = y_{i-P} \tag{4}$$

Now set $$w_i = y_{i-P-1} \tag{5}$$

to be the output from the bandpass filter along signal path 215b at times i–P–1. Each sequence, namely $y_i$, $x_i$, $w_i$, is of the same length, denoted as N. A two-tap prediction filter has its coefficients computed by minimizing the squared error with respect to each of the coefficients by a technique known in the art, and described, for example, in *Solving Least Squares Problems,* Hanson & Lawson, Prentice-Hall, 1967. Accordingly, the squared error is $$E^2 = \sum_{n=0}^{N-1} [y_n - a \cdot w_n - b \cdot x_n]^2 \tag{6}$$

where a and b are the prediction coefficients. Defining the correlation as $$C_{uv} = \sum_{n=0}^{N-1} u_n v_n \tag{7}$$

where u and v could be any of x, y, and w. Then, using the techniques in the above-mentioned Hanson et al. text, $$\frac{\delta \epsilon^2}{\delta a} = 2_a C_{ww} - 2C_{yw} + 2_b C_{xw} = 0 \tag{8}$$

$$\frac{\delta \epsilon^2}{\delta b} = 2_b C_{xx} - 2C_{yx} + 2_a C_{xw} = 0$$

so $$a = \frac{C_{xw} C_{yx} - C_{xx} C_{yw}}{C_{xw}^2 - C_{xx} C_{ww}} \tag{9}$$

$$b = \frac{C_{xw} C_y - C_{ww} C_{xw}}{C_{xw}^2 - C_{xx} C_{ww}}$$

so
The resulting prediction error power $\epsilon^2$ computed by block 1012 is given by $$\epsilon^2 = C_{yy} + a^2 C_{ww} + b^2 C_{xx} - 2a C_{yw} - 2b C_{yy} + 2ab C_{yw} \tag{10}$$

This calculation is re-computed for all values of p in the range of p–10 to p+10 of the estimated pitch value from signal path 215b.

From block 1012 of FIG. 10, the prediction error power signals $\epsilon^2$ for all values of p are applied to a minimum selector block 1018, which represents selection of $\bar{P}$, which is that one of the prediction power signals P received from block 1012 which minimizes the prediction error ($\epsilon^2_{min}$). The minimum-error power signal $\bar{P}$ is applied to a further block 1020, which represents a transformation from the minimum-error power to a measure $r_1$ of voicing. This is accomplished by $$r = 1 - \frac{\Sigma \epsilon^2_{min}}{\Sigma y_m^2} \tag{11}$$

where $Y_M^2$ are the samples on path 215b. The voicing signal $r_1$ FOR THE 625–1250 Hz band is applied over path 235 to the jitter correction block 236 of FIG. 2a.

In FIG. 10, the value of $\bar{P}$, which is the pitch interval for which $\epsilon^2$ was minimized, is applied over a signal path 1022 to a control input port of each of prediction error determining blocks 1010, 1014, and 1016, each of which is identical to block 1012. Each of prediction error determining blocks 1010, 1014, and 1016 receives $\bar{P}$, and operates upon it in the manner described in equations 4–10, substituting $\bar{P}$ for p in the equations. The value of $\epsilon^2$ produced by each of blocks 1010, 1014, and 1016 is applied to a minimum selector block 1028, 1038, and 1048, respectively. Blocks 1028, 1038, and 1048 are each identical to block 1018, and merely select that one minimum prediction error power $\epsilon^2$ for each value of P. The values of $\bar{p}$ from blocks 1028, 1038, and 1048 are discarded, and the values of $\epsilon^2$ are applied to blocks 1030, 1040, and 1050, each of which is identical to block 1020. The $r_0$, $r_2$, and $r_3$ signals produced by blocks 1030, 1040, and 1050, respectively, are applied over signal paths 235, together with $r_1$, to jitter correction block 236 of FIG. 2a.

The estimated voicing ($r_i$) in each band, which is coupled from correlator block 234 of FIG. 2a by paths, designated together as 235, is corrected in jitter correction block 236 for low estimates which occur when the speech signal is highly aperiodic. Jitter correction block 236 of FIG. 2a simply takes the square root of each of the four r signals which it receives when the one-bit signal on its signal path 232 indicates the presence of jitter, and passes the four resulting square-root signals to output path 242. When jitter is not present, block 236 simply passes the four r signals unchanged to the output. This action is performed twice per frame, with the result that eight correlation signals are generated on path 242 for each frame.

Thus, if the frame is aperiodic as determined by pitch epoch detector 220 of FIG. 2a, the correlation values are then corrected within jitter correction block 236 to compensate for the reduction in correlation caused by this aperiodicity. In the preferred implementation, the correlation is replaced in each band by its square root, also in jitter correction block 236. Other linear or nonlinear corrections can be used.

The frame power signals produced on signal path 217 by block 216 of FIG. 2a, the line spectrum information produced on signal path 226 by conversion block 224, the pitch value signals produced on signal path 223 by pitch tracking block 222, and the coefficients produced on signal path 242 by jitter correction block 236, must all be coded before transmission over transmission path 18 of FIG. 1 to the receiver. The coding operations are performed by the arrangement of FIG. 2b.

Figure 2B:
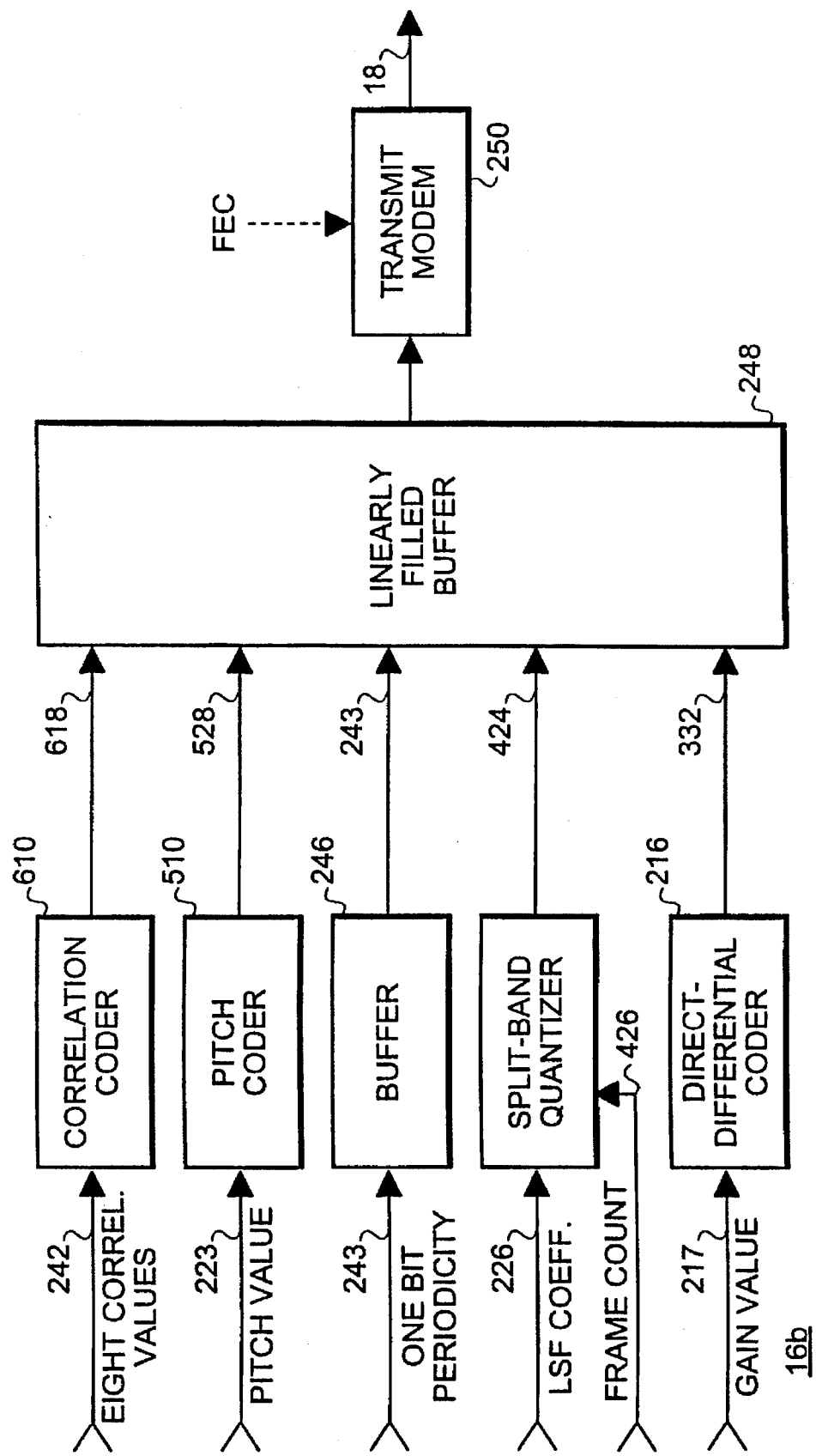
FIG. 2b is a simplified block diagram of an encoding portion of the extractor and coding block of the arrangement of FIG. 1.

FIG. 2b is a simplified block diagram of the encoding portion of block 16 of FIG. 1. In FIG. 2b, eight correlation values are applied over path 242 to a correlation coder 610, a pitch value signal is coupled to a pitch coder 510 over a signal path 223, a one-bit periodicity signal is applied by way of a path 243 to a buffer 246 for time delay equalization, the line spectral frequencies (LSF) signals are applied over a path 226 to a split-band quantizer arrangement 410, and the gain value signals are applied over a path 217 to a block 216, representing direct differential coding. The resulting coded signals are applied over paths 618, 528, 243, 424, and 332, respectively, to a linearly filled buffer 248. Buffer 248 buffers and concatenates the various codewords to produce the codeword to be transmitted. The concatenated codeword is applied from buffer 248 to a modem 250, and onto limited-data-rate path 18. The modem may employ forward error correction (FEC) coding, as known in the art.

Figure 3:
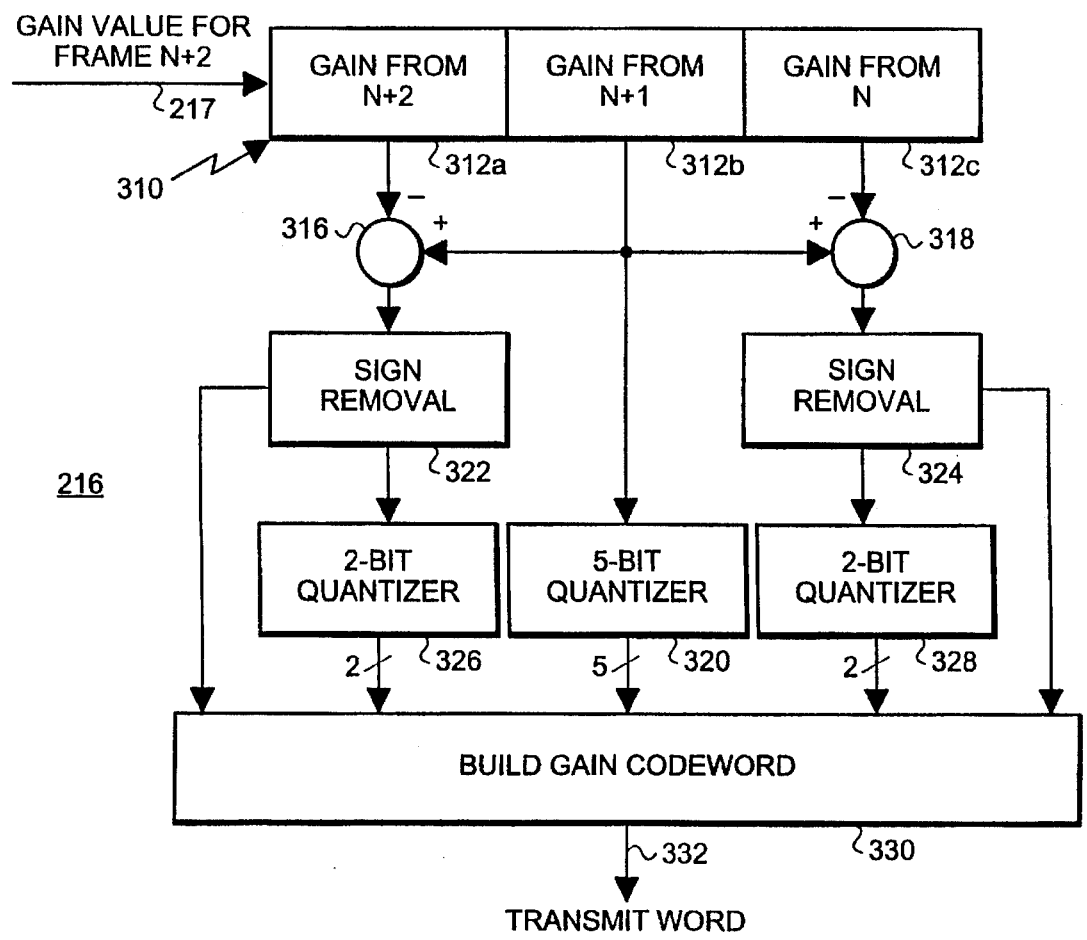
FIG. 3 is a simplified block diagram of the gain coding portion of the extractor and coding block of the arrangement of FIG. 1.

FIG. 3 is a simplified block diagram of direct differential coder 216 of FIG. 2b, which codes the frame power (gain) signal. The frame power signals are applied, one frame at a time, from signal path 217 to a multiframe buffer or register 310. As illustrated, the buffer includes three registers 312a, 312b, and 312c, which may be viewed as containing newest frame power signal from frame N+2 in register 312a, the previous frame power N+1 in register 312b, and the oldest frame power N in register 312c. The frame power in the center register 312b is applied over a path 314 to the noninverting (+) input ports of a pair of subtractors 316 and 318. The newest frame power signal is applied from register 312a to the inverting or subtracting input port (−) of subtractor 316, and the oldest frame power signal is applied from register 312c to the inverting input port of subtracting circuit 318. The N−1 frame power in the center register 312b, termed the "direct frame," is also applied to a nonuniform logarithmic five-bit quantizer 320, which quantizes the direct frame power signal to 32 levels. Quantizer 320 uses a conventional Lloyd-Max I algorithm to generate the desired codewords. Sign removal circuits 322 and 324 remove the sign information from the difference signals produced by subtracting circuits 316 and 318, respectively, to produce absolute-value difference signals. Those skilled in the art know that the functions provided by blocks 322 and 324 may be accomplished by simply terminating (not using) that one bit of the subtracting circuit outputs which represents sign information. The absolute-value difference signal produced by block 322 is applied to a nonuniform two-bit quantizer 326, and the absolute-value difference signal produced by block 324 is applied to a nonuniform two-bit quantizer 328, for quantizing to four levels. The outputs of quantizers 320, 326, and 328 are applied to a block 330, which represents an arrangement for generating a product codeword for three frames of gain or signal power information. One simple way to produce the gain codeword is to concatenate the three quantized words from blocks 320, 326, and 328. The resulting gain codeword is produced on signal path 332 of FIG. 3, from which it is applied to buffer 248 of FIG. 2b.

Figure 4A:
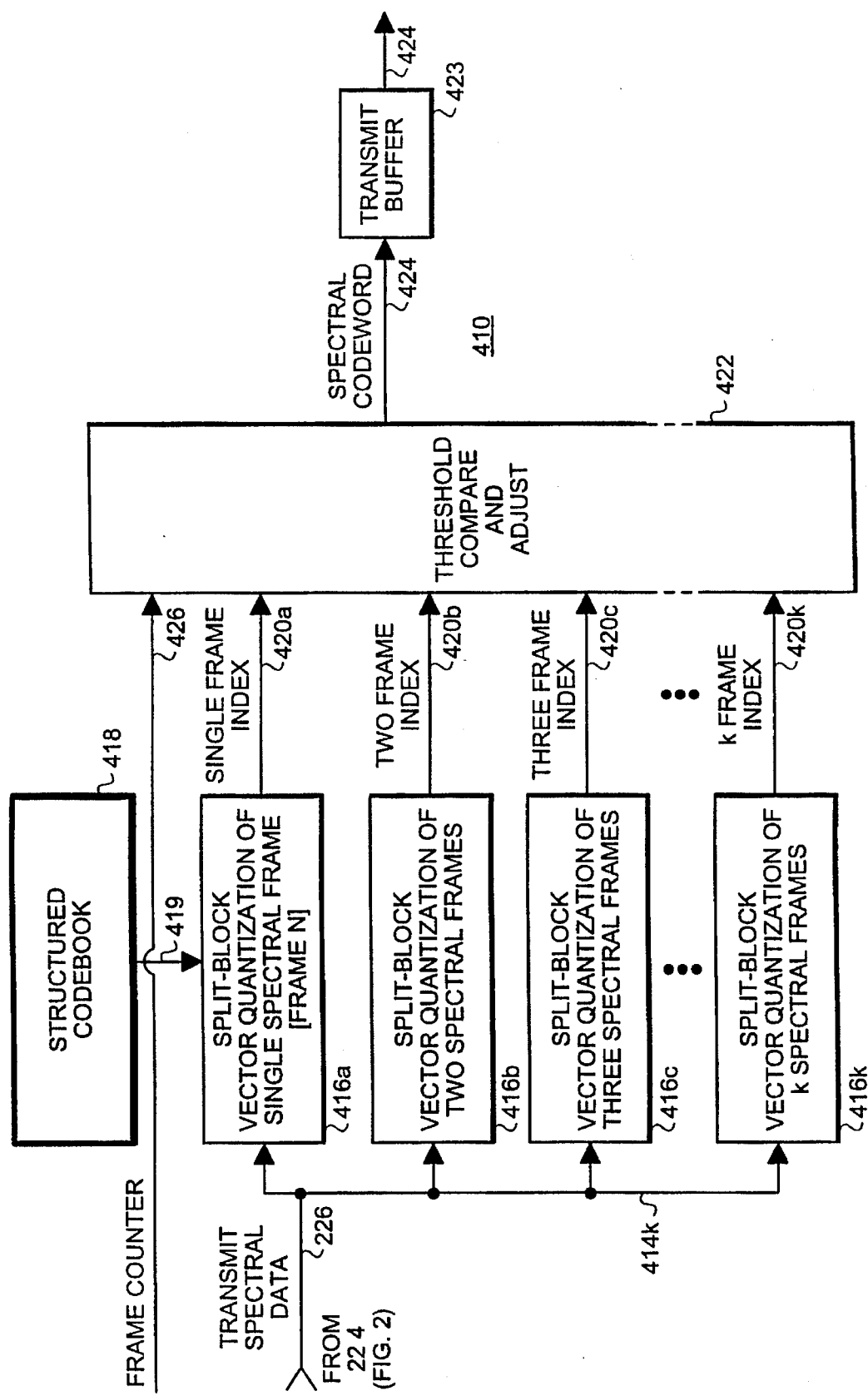
FIG. 4a is a simplified block diagram of the spectral quantizer coding portion of the extractor and coding block of the arrangement of FIG. 1, and FIGS. 4b and 4c are flow charts illustrating the operation of the arrangement of FIG. 4a in selecting codewords for transmission.

FIG. 4a is a simplified block diagram of a vector quantizer mapper 410, which codes the LSF coefficients or transmit spectral data received by the arrangement of FIG. 2b over signal path 226 from converter 224 of FIG. 2a. Vector quantizer mapper 410 of FIG. 4a automatically selects the SBVQ block length (the number of frames in the current block which is being encoded as a whole) which is most appropriate to the speech being coded. In general, the vector quantizer mapper 410 encodes a single frame of information, and in parallel encodes the current frame with multiple previously encoded frames, to thereby provide the ability to adapt the codebook length to the basic temporal structure of speech. For example, if the input speech frame is the result of a plosive or stop, a single 22.5 mSec frame will provide good reproduction; however, for vowels and most diphthongs, longer blocks of frames (up 90+ ms) can be used with high fidelity, with the concurrent reduction in the instantaneous data rate.

The transmit spectral data on signal path 226 of FIG. 4a is composed, in one embodiment, of fourteen unquantized line spectral frequencies. These fourteen coefficients are then split into two groups: one composed of the first eight line spectral frequencies, the other of the remaining six line spectral frequencies. These data are input into each of the SBVQ blocks (416a, 416b, 416c, . . . 416k). The SBVQ block 416a is a length 1 SBVQ (it encodes the line spectral frequencies of one frame, which is the current frame); SBVQ block 416b is a length 2 SBVQ (encodes the current frame and the previous frame as one set); SBVQ block 416c is a length 3 SBVQ; and SBVQ block 416k is of length k. It was found that a maximum block length of four frames was sufficient to achieve the desired fidelity and data rates. It is noted that each of the SBVQ blocks generates two codewords: one codeword for the first eight coefficients, and one for the remaining six coefficients, as described above in simplified fashion in conjunction with FIG. 4d. In vector quantizer mapper 410 of FIG. 4a, the full set of spectral coefficients representing the spectral information is divided into a plurality of subsets of coefficients. Each subset of coefficients includes K spectral frames, where K ranges from two to four, and is preferably three, different from the other subsets. Each subset is coupled to a vector quantizer 416a, 416b, 416c, . . . 416k for a particular number of frames.

Each vector quantizer 416a, 416b, .. of FIG. 4a is coupled by a path 419 to a ROM codebook illustrated as 418, for accessing codewords therefrom. The first frame is quantized using a one-frame vector quantizer (VQ) 416a, operating as described above. More particularly, vector quantizer 416a quantizes for a single spectral frame, namely the current frame, by searching the C and D codebooks for the minimum distortion according to equation (1) to generate the single-frame index, or the first of the codewords, on signal path 420a. Simultaneously, the first two frames (the current frame and the previous frame) are quantized by two-frame vector quantizer 416b, and so on, up to K frames. More particularly, vector quantizer 416c receives the spectral coefficients of three sequential frames, searches for the minimum distortion of the three concatenated frames, and generates a three-frame index on output signal path 420c. All the other vector quantizers perform similarly, with vector quantizer 416K buffering K−1 prior frames, and, in conjunction with the current frame, produces a K-frame index on signal path 420K. In the preferred embodiment, each of these SBVQs 416 generates 24-bit codewords or indices, so the 1-frame VQ would transmit 24 bits per frame, the 2-frame VQ would transmit 12 bits/frame, the 3-frame VQ would transmit 8 bits/frame, etc. Thus, the throughput delay is variable from one frame to k frames, but the transmitted codeword is of a fixed length.

The codewords are applied from the SBVQs 416a–416k of FIG. 4a by way of signal paths 420a, 420b, 420c, . . . 420k to a threshold comparison and adjust block 422. Basically, block 422 selects among the codewords in a manner which tends to maintain a particular output data rate on its output signal path 424 and into the associated transmit buffer 423. The data rate out of the transmit buffer 423 is held to a predetermined value, to maintain synchronization in the modems at each end of the transmission path. Remembering that the codewords have equal bit length, it is clear that simply selecting one codeword over another, in itself, will not affect the transmitted data rate. However, selection of a codeword which represents the frequency spectrum of a large plurality of frames taken as a set, instead of a codeword which represents only one frame, or only a few frames, results in fewer codewords being generated for transmission per unit time, which ultimately results in a lesser data rate. Block 422 contains the decision logic to select which of the 24 bits-per-frame (bpf), 12 bpf, 7 bpf . . . outputs to transmit. Block 422 also receives frame count information from frame counter 252 of FIG. 2a by way of path 426, for aiding in selection of the appropriate codeword. Thus, block 422 of FIG. 4a keeps the average bit rate constant while minimizing the error introduced by the vector quantizers. It does this, in general, by comparing the compression or coding distortion of each VQ 416a with the distortion of the VQ which encodes the next higher number of frames. It then selects for transmission, and stores in a first-in, first out transmit buffer 423, the "longest" VQ whose added distortion (compared to the one-frame VQ) is less than a threshold. Block 422 also monitors the bit rate entering transmit buffer 423. The amount of fill or ullage of the transmit buffer is not directly measured, but the same effect is accomplished by monitoring the input data rate of the buffer, since its output data rate is the constant desired data rate for transmission over the limited data-rate path 18. As the codeword generation bit rate increases above the desired value, the buffer tends to fill, and the threshold value is increased in response to the higher codeword generation bit rate. This increased threshold value tends to cause longer VQ's to be selected, thus tending to decrease the average bit rate at which the codewords are generated and applied to the buffer, whereby the buffer fills more slowly, while being emptied into the transmission path at the relatively constant data path rate. The tendency toward a decreased fill rate, coupled with a constant data path transmission rate, tends to reduce the buffer ullage. When the bit rate at which the codewords are generated and applied to the buffer decreases, the buffer tends to empty, and the threshold is decreased in response. This tends to cause codewords to be selected which represent fewer frames than when the buffer is full. The codewords are therefore generated and applied to the buffer at a greater rate than that at which the buffer is being emptied onto the data transmission path. This combination of actions tends to maintain the buffer fill at a constant value, which means that the codewords are generated at the same average rate as that at which transmit buffer 423 is being emptied, and allows a constant data rate over transmission path 18, with the least distortion. Block 500 of FIG. 4a therefore acts as a feedback loop tending to maintain the bit rate at the desired value, by selecting among the codewords, in a manner which tends to minimize the coding distortion or error. The resulting spectral codeword is produced on signal path 424 for application to transmission modem 426, and is transmitted over signal path 424 to codeword-concatenating buffer 248 of FIG. 2b.

Figure 4B:
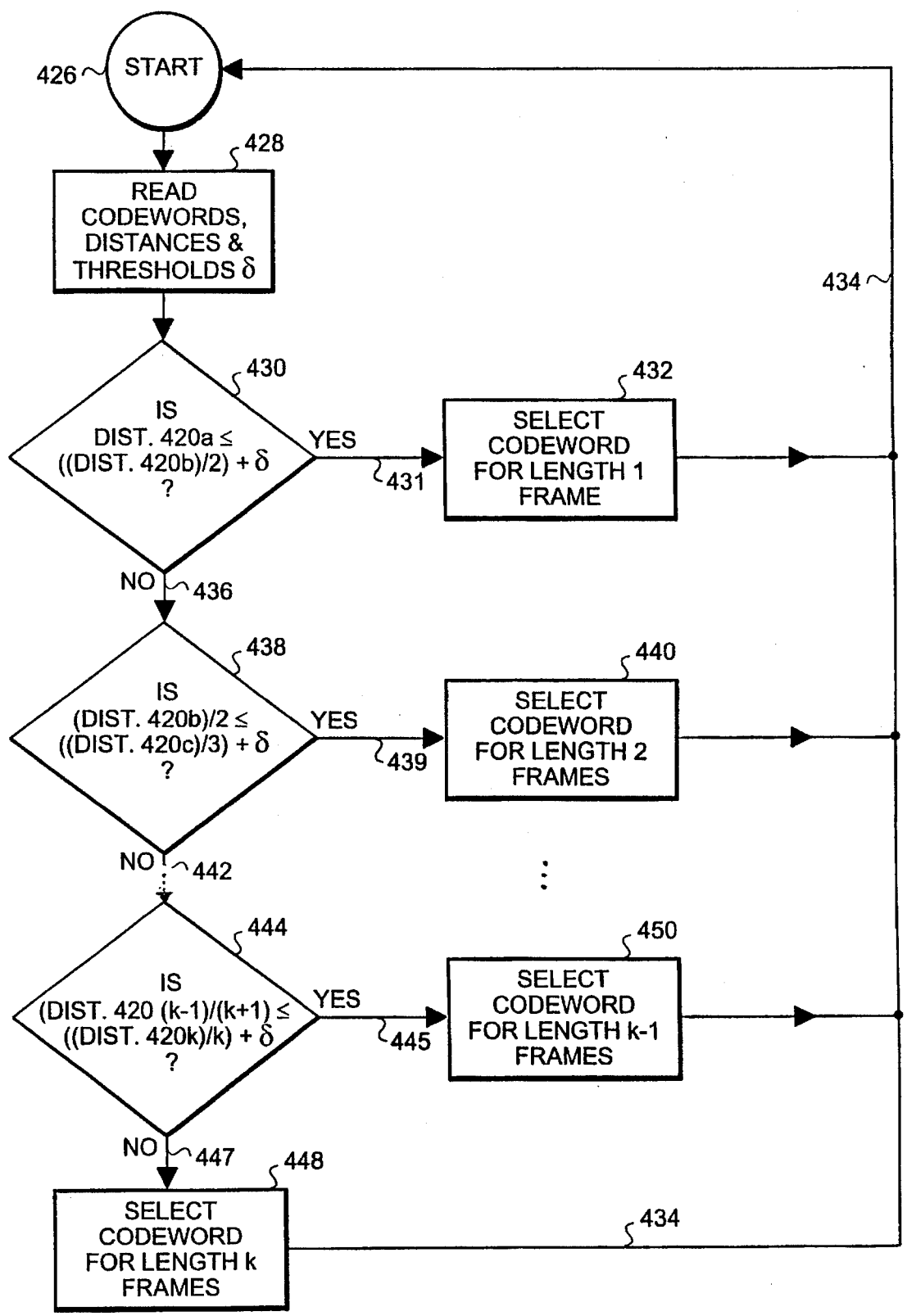

FIG. 4b is a simplified flow chart illustrating the codeword selection portion of the action performed by block 422 of FIG. 4a. In FIG. 4b, the logic flow starts at a START block 426, and flows to a block 428, which represents the reading of the codewords flowing from the split-block vector quantizers $416_x$ during each frame, the distances, and the current value of the threshold $\delta$. From block 428, the logic flows to a decision block 430, in which the distance represented by the single-frame index (Dist. 420a) on signal path 420a of FIG. 4a is less than or equal to half the double-frame index ((Dist. 420b)/2) on signal path 420b, plus the threshold value $\delta$. If the distance of the single-frame index is less than half the two-frame index plus threshold, the logic exits decision block 430 by the YES output 431, and flows to a block 432, which represents selection of the one-frame index as the next codeword. From block 432, the logic flows by way of logic path 434 back to START block 426. If the distance of the single-frame index is equal to, or more than, half the two-frame index plus the threshold, the logic leaves decision block 430 by the NO path 436, and flows to the next decision block 438.

Decision block 438 of FIG. 4b compares half the distance of the two-frame index or codeword ((Dist. 420b)/2) with one-third of the distance of the three-frame index ((Dist. 420c)/3) plus threshold $\delta$. If half the distance of the two-frame index is less than or equal to one-third of the distance of the three-frame index plus $\delta$, the logic leaves decision block 438 by the YES output 439, and flows to a logic block 440, which represents selection of the two-frame index or codeword. From block 440, the logic flows by path 434 back to START block 426. If decision block 438 finds that half the distance of the two-frame index is greater than one-third of the three-frame index plus threshold, the logic exits block 438 by way of NO output 442. The logic process repeats, until the last decision block 444 is reached, which compares the distance of the (K–1 th) index, divided by (K–1), with the Kth index divided by K, plus $\delta$. If the (K–1 th) index is less than or equal to the sum of the threshold with the Kth index, divided by K, the logic flows from decision block 444 by YES output 445, to a block 450, which represents selection of the K–1 th codeword for transmission. Otherwise, the logic flows by a path 447 to a block 448, which represents selection of the Kth codeword.

Figure 4C:
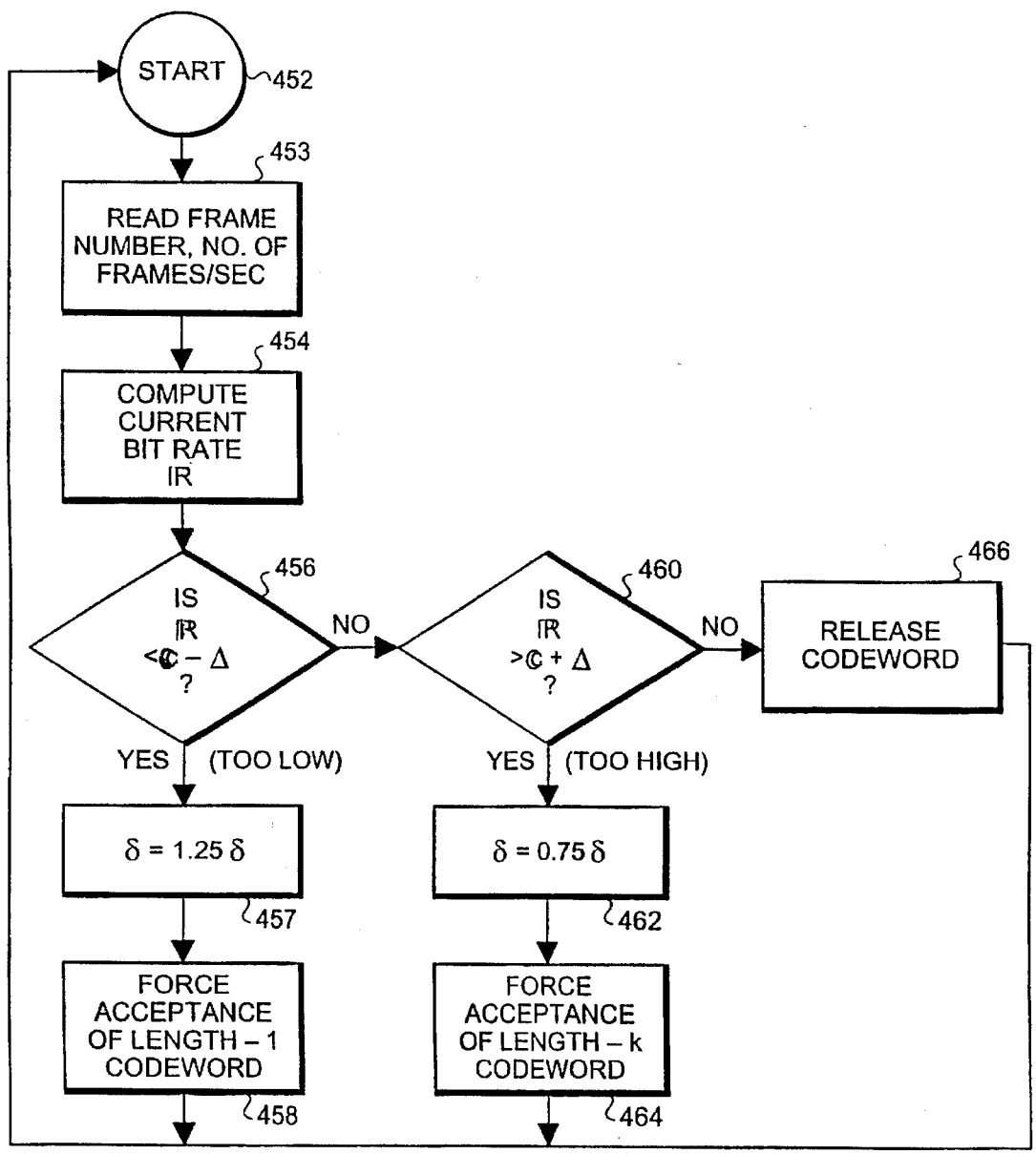

FIG. 4c is a simplified flow chart illustrating the threshold adjustment function performed by block 422 of FIG. 4a. In FIG. 4c, the logic starts at a START block 452, and flows to a block 454, which represents determination of the current output bit rate R from block 422 to buffer 423 of FIG. 4a. For this determination, the desired number of frames-per-second (the data rate of path 18 of FIG. 1) must be known, and the number of frames represented by the current codeword must be known. From block 454, the logic flows to a decision block 456, in which the current bit rate R is compared with target rate C+$\Delta$, where $\delta$ is a fixed tolerance value, taken as a constant dependent upon the overhead bits required by the forward error correcting scheme in the transmit modem. If R is less than C–$\Delta$, the frame rate into the buffer is less than the desired frame rate, and the logic flows by the YES output to a block 457. Block 456 represents setting the value of threshold $\delta$ to a particular value greater than unity, illustrated as being 1.25 $\delta$. If the buffer 423 of FIG. 4a is large, the throughput delay may be larger than desired. Consequently, it is desirable to have a small buffer. However, when the buffer is small, and has been receiving a frame rate less than its output frame rate, it may be about to run out of data. To prevent the buffer from running out of data, the logic of FIG. 4c flows from block 457 to a further block 458, which represents forcing acceptance of a one-frame-length index or codeword, rather than another codeword which might otherwise be optimal. From block 458, the logic flows back to START block 452.

In FIG. 4c, if the current bit rate R is greater than, or equal to, the target rate C minus tolerance $\Delta$, the logic leaves decision block 456 by the NO path, and arrives at a further decision block 460. Block 460 compares the current bit rate R with C+$\Delta$. If R is greater than C+$\Delta$, the data input rate to the buffer is too great, and the logic leaves decision block 460 by the YES path, and arrives at a block 462. Block 462 represents the setting of the current value of $\delta$ to 0.75 $\delta$. The logic then flows to a block 464, which represents the forcing of acceptance of a maximum-length (length-K) codeword, to prevent buffer overflow. From block 464, the logic flows back to START block 452. If the current bit rate R is less than or equal to the target bit rate C+$\Delta$, the logic flows from decision block 460 by the NO output to a block 466, which represents the release of the current codeword selected by the logic flow of FIG. 4b.

As mentioned above, the threshold comparison and adjust block 422 of FIG. 4a accomplishes its result by comparing its own output bit rate with the desired bit rate, and makes no changes if the bit rates are equal. If the output bit rate is higher than the desired bit rate, a scalar multiplier is reduced, so the threshold signal δ is multiplied by a smaller number, and is therefore itself reduced in magnitude. Conversely, if the bit rate is lower than the threshold, the scalar multiplier value is increased.

Figure 5:
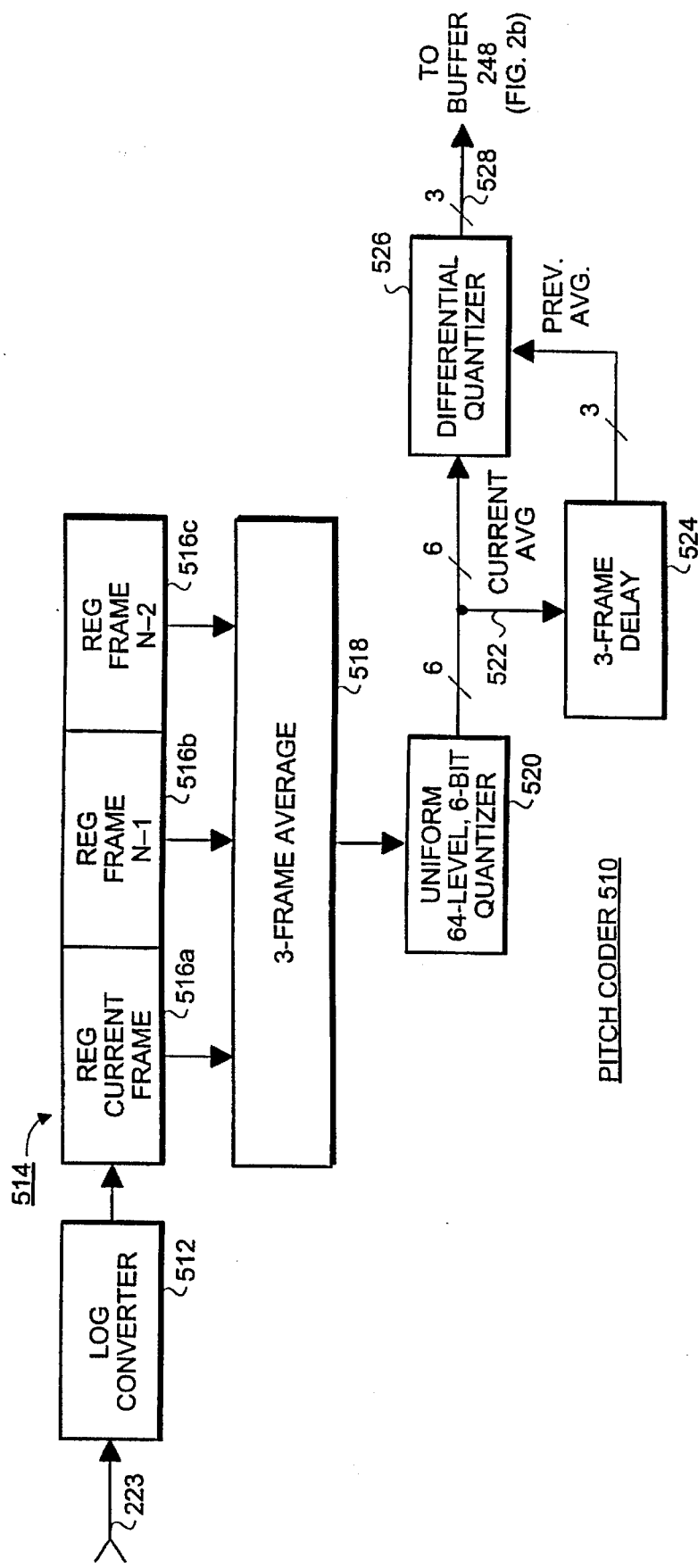
FIG. 5 is a simplified block diagram of the pitch coding portion of the extractor and coding block of the arrangement of FIG. 1.

The pitch value generated on path 223 by pitch tracking block 222 of FIG. 2a is coded by a pitch coding arrangement 510 of FIG. 2a, illustrated in more detail in FIG. 5. The average pitch interval of speech varies slowly with time. Therefore, the pitch value does not need to be transmitted frequently. In the preferred implementation, the pitch value is sent every three frames, as described below. In FIG. 5, the pitch value signals on signal path 223 are applied to a base-ten logarithmic converter 512, and the log-converted pitch values are coupled to a buffer designated generally as 514, including registers 516a, 516b, and 516c. Each buffer $516_x$ contains pitch information relating to one frame. More particularly, pitch information relating to the oldest frame is contained in buffer 516c, of the newest or current frame, in buffer 516a, and pitch information relating to the "direct" frame is contained in center buffer 516b. The pitch information from the various buffers $516_x$ is applied to a block 518, which averages the pitch values over the three frames. The average is not a running average, so the value of the average remains constant for three frame intervals. The three-frame average pitch signal produced by block 518 is applied to a 64-level quantizer 520, which quantizes the signal to six bits. The quantized signal is applied over a signal path 522 to a three-frame delay 524 and to a differential quantizer 526, which also receives the three MSB (eight levels) of the three-frame delayed signal from delay 524. Differential quantizer 526 receives the six-bit current-frame-set signal from quantizer 520, and the three-bit delayed-frame-set signal from delay 524, and produces, on a signal path 528, in known fashion, a three-bit encoded pitch signal representing the difference. The encoded pitch signal is applied from path 528 to concatenating buffer 248 of FIG. 2b.

Figure 6:
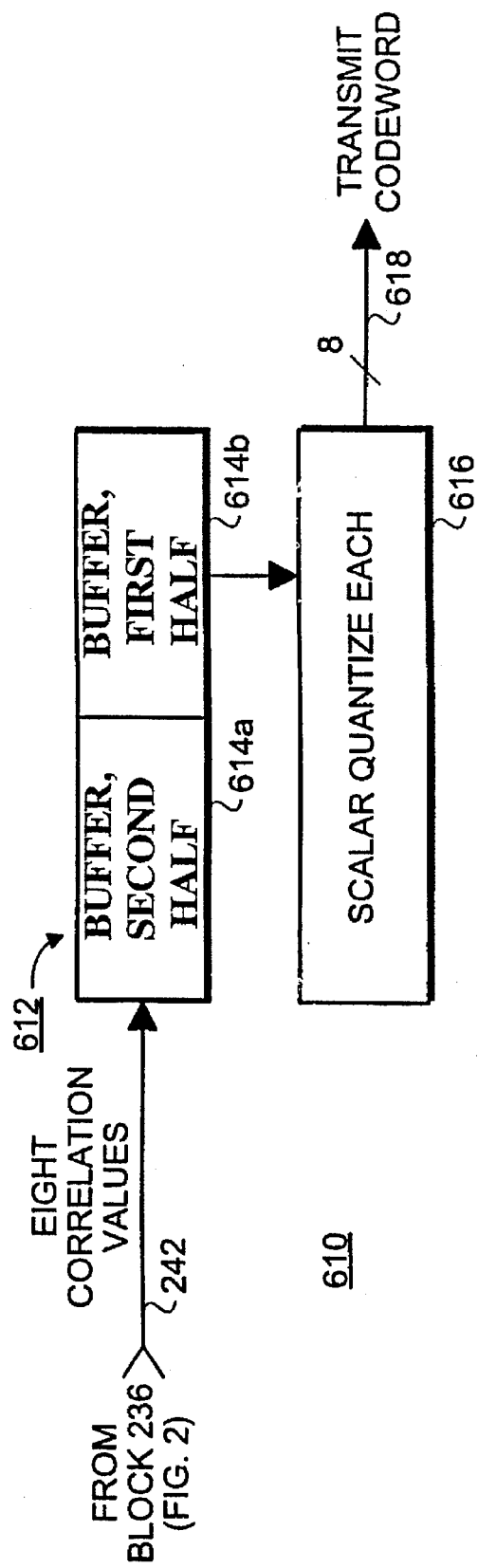
FIG. 6 is a simplified block diagram of the correlation coding portion of the extractor and coding block of the arrangement of FIG. 1.

The jitter-corrected correlation values from block 236 of FIG. 2a are applied by way of signal path 242 to a correlation signal coder 610 of FIG. 2b, illustrated in more detail in FIG. 6. The correlation values are applied from path 242 to a buffer, designated generally as 612, which includes registers 614a and 614b, which are clocked to separate the coefficients associated with the first half of the current frame from those associated with the second half of the frame. The coefficients for the first half of the frame are first clocked to register 614b, while the second-half coefficients enter register 614a. The coefficients associated with the first half of the frame are extracted from buffer register 614b, and applied to a scalar quantization block 616. Quantization block 616 represents a nonuniform quantizer which uses the abovementioned Lloyd-Max I algorithm, which maps each of the four correlation coefficients into a codeword. The resulting transmit correlation codeword, composed of four concatenated two-bit codewords, one associated with each frequency band filtered by filter bank 214 of FIG. 2a, is generated on an eight-bit signal path 618 of FIG. 6, from whence it is applied to an input of concatenating buffer 248 of FIG. 2b. In a particular embodiment of the invention, in which the data rate in signal path 18 of FIG. 1 is 1000 bps, the total number of coefficients is eight, and the four coefficients for the second half of each frame are not used. Instead, the four coefficients of the first half of the frame, after processing, are repeated at the receive side; this is found to result in only a 2 dB degradation or distortion. For higher data rate systems, all eight coefficients could be transmitted, with a corresponding 2 dB improvement in distortion.

Referring to FIG. 2b, the coded gain on signal path 332, the spectral codeword on signal path 424, the 1-bit periodicity codeword on signal path 243, the pitch codeword produced on output signal path 528, and the correlation codeword on signal path 618 are all combined for transmission by linearly filled or concatenating buffer 248, and applied to a transmit modem 250, for transmission over limited-bandwidth transmission path 18 of FIG. 1.

Figure 7:
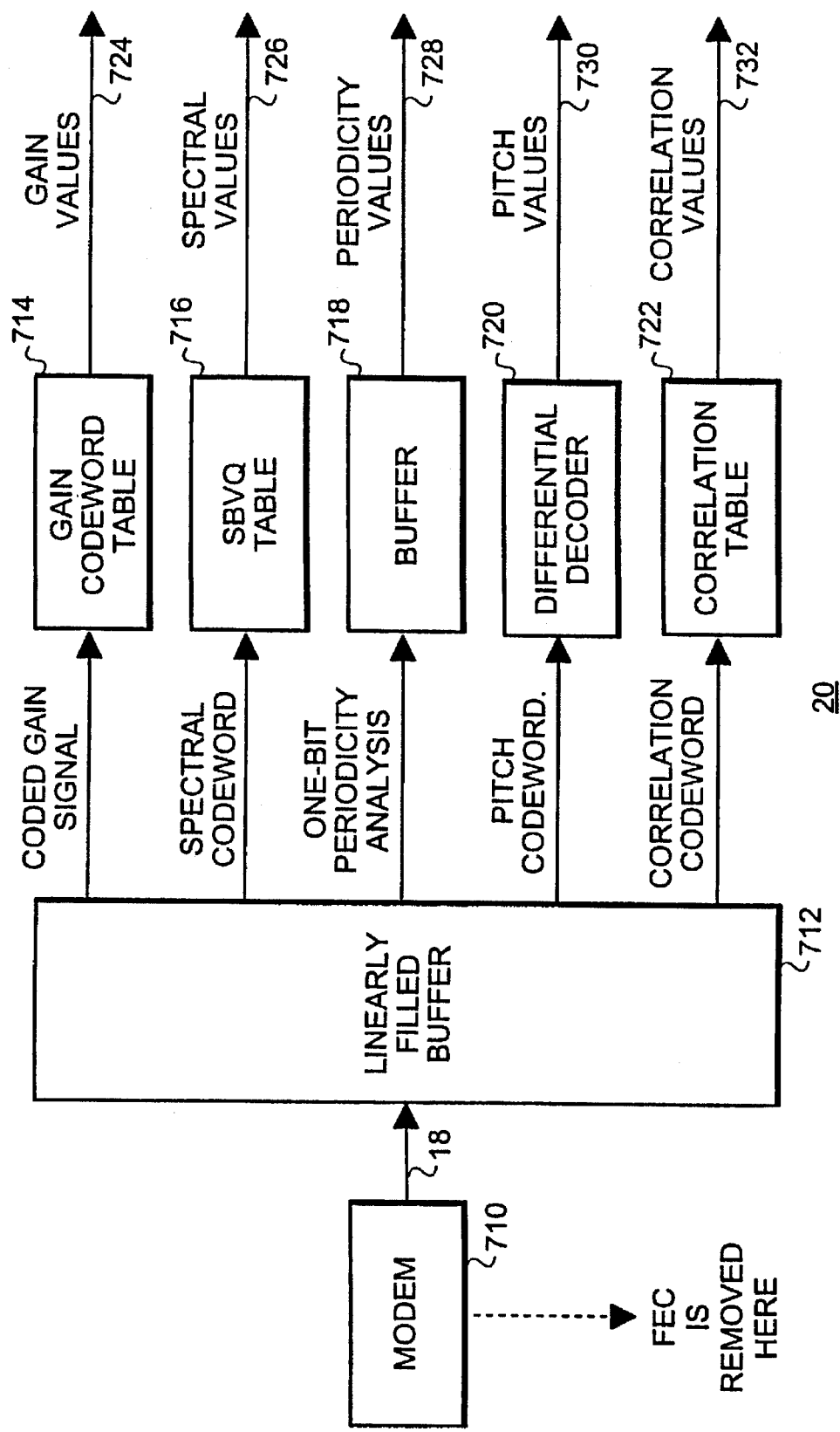
FIG. 7 is a simplified block diagram of a decoder which is used at the receiving end of the transmission path of the arrangement of FIG. 1.
Figure 12:
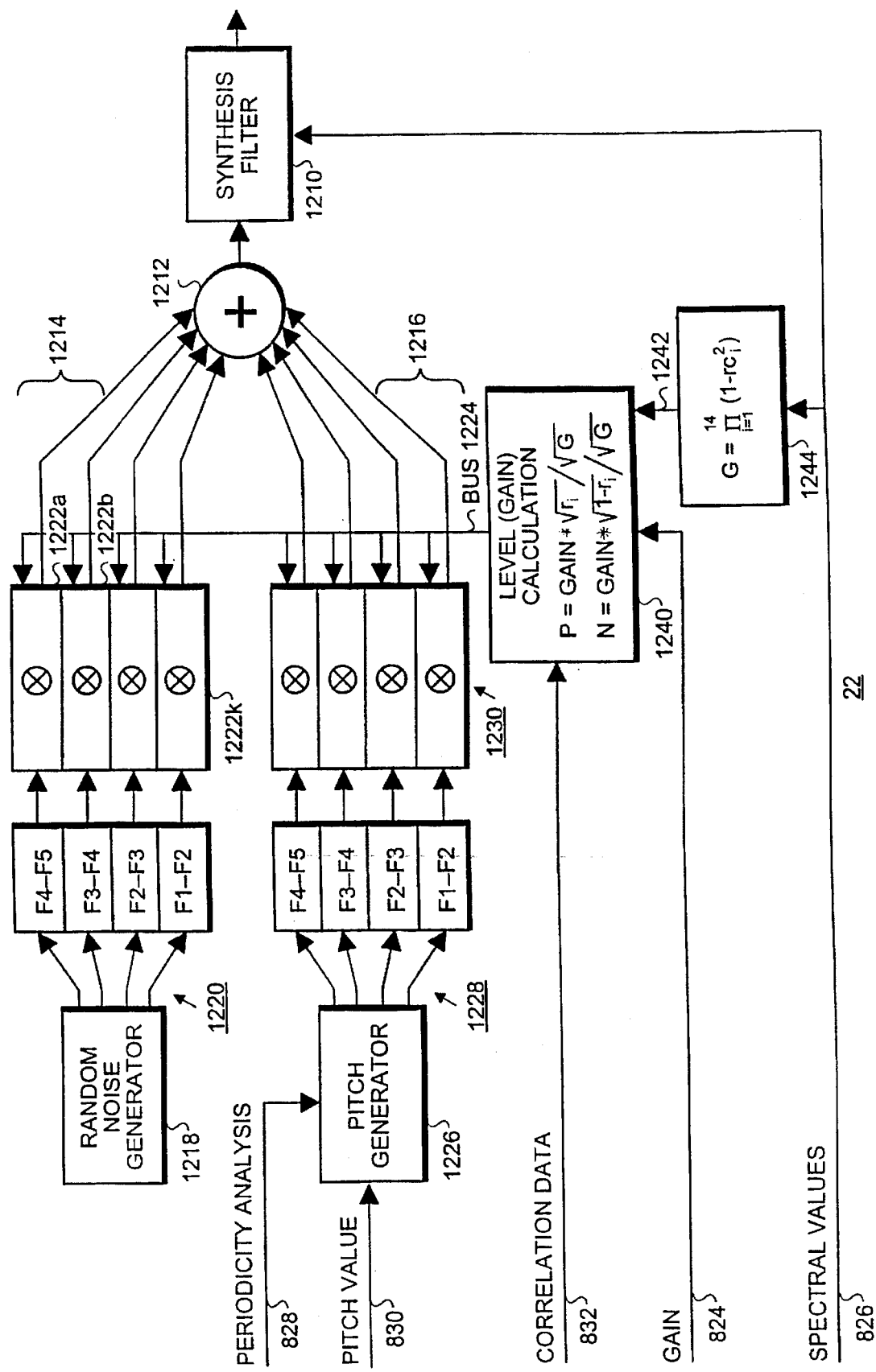
FIG. 12 is a simplified block diagram of a speech synthesizer which may be used at the receiving end of the low-data-rate path of FIG. 1.

At the receiving end of transmission path 18 of FIG. 1, decoder and processor 20 decodes the codewords or indices, to produce synthesizer driver signals, which are applied to synthesizer 22. FIG. 7 is a simplified block diagram of decoder and processor 20, and FIG. 12 is a simplified block diagram of the speech synthesizer portion of decoder and processor 20. In FIG. 7, the signal arriving from signal path 18 is received by a modem 710, demodulated and loaded into a linearly filled buffer 712. Buffer 712 loads the concatenated indices, and unloads them in the correct order to the various specific decoder functions. More particularly, the coded gain signal is coupled to a gain codeword decoder 714, the spectral codeword is coupled to a SBVQ decoder 716, the one-bit periodicity signal is coupled to a time-equalizing buffer 718, the pitch codeword is coupled to a pitch codeword differential decoder 720, and the correlation codeword is coupled to a correlation codeword decoder 722. The gain signal decoder 714, the spectral codeword decoder 716, and the correlation signal decoder 722 may simply be look-up (ROM or RAM) tables which are loaded with data identical to that with which the corresponding encoder table is loaded, and produce the desired decoded information on their output signal paths 724, 726, and 732, respectively. For example, the gain codeword decoder 714 may include a look-up table similar to that of block 330 of FIG. 3. The pitch codeword decoder 720 is a differential decoder, known in the art, for undoing the effect of differential quantizer 526 of FIG. 5, and produces its decoded signal on signal path 730. The time-delayed or buffered one-bit periodicity signal is generated on signal path 728.

Synthesizer 22 of FIG. 1 receives gain values, spectral values, pitch values, and correlation values from decoder and processor 20 of FIG. 7. FIG. 12 is a simplified block diagram of synthesizer 20 of FIG. 1. In FIG. 12, a speech synthesizer filter 1210 receives a mixed-excitation input signal from an adder 1212, and filters the input signal in response the spectral value signals on signal path 726, to thereby emphasize the components of the mixed-excitation signal which corresponds to the pitch pulses of the input speech signal. The mixed-excitation signal is produced in adder 1212 by adding signals from two sources, a first being a random-noise generator path 1214, and the second being a periodic-pulse path 1216. Random-noise path 1214 includes a random-noise generator 1218, which produces random noise, and applies it to a filter bank 1220, in which four filters have bandpasses which correspond with those of filter 214 of FIG. 2a. The filtered noise bands are applied to multipliers 1222a, 1222b, ... 122k, which multiply the noise in each band by a multiplicand for that individual band, received over a bus 1224. The modulated noise signals are applied from multipliers 1222 to inputs of adder 1212.

In the periodic pulse path 1216 of FIG. 12, periodic signals are generated by a pitch generator 1226, which is essentially a pulse or tone generator, the frequency or interpulse period of which is established by the pitch value signal applied over signal path 730, when the periodicity analysis or jitter signal on signal path 728 indicates no jitter. When jitter is indicated, the interpulse period of the pitch pulses produced by generator 1226 is randomly jittered by about 25%. The pitch pulses produced by generator 1226 are filtered by a filter bank 1228, which has the same frequency bands as filter bank 1220. The filtered pitch pulses are individually multiplied in a set of multipliers 1230 by a gain signal individual to each band, which is applied to the multipliers over bus 1224.

The gain signals on bus 1224 are generated by a block 1240. The gains for the pulse path are calculated by multiplying the square-root of the correlation data received over signal path 832 (four values per frame) by the gain received by way of path 824, and dividing by a filter gain signal applied by way of a path 1242 from a block 1244. The gains for the noise path are calculated using the same four correlation values; the square-root of one-minus-the-correlation-values are multiplied by the gain values from path 724, and divided by the filter gain signal. All eight multiplier signals are applied over bus 1224 to their respective multipliers. Block 1244 determines the filter power by $$G = \prod_{i=1}^{14} (1 - rc_i^2) \qquad (14)$$

The synthesized speech simile signal produced by synthesizer 22 of FIG. 1 is in digital form. Further conventional processing, such as by digital-to-analog (DAC) processing is performed by means (not illustrated) to generate an analog speech simile signal, and further analog processing may be performed, if desired, for amplification and the like. The analog speech simile signal is applied to a speech reproducing device, illustrated as a loudspeaker 24 in FIG. 1.

The system according to the invention, operating at an input information signal sample rate of 10 kilosamples/sec, and with a 22.5 msec frame rate, produces more intelligible speech through a 1000 bps signal transmission path than the abovementioned Federal Standard 1015 LPC algorithm through a 2400 bps signal transmission path.

Other embodiments of the invention will be apparent to those skilled in the art. For example, the data rate of the information signal may be increased in proportion to the available transmission path data rate. While particular processing has been described, equivalent processing techniques may be used.

What is claimed is:

1. A method for transmitting information with a fluctuating frequency spectrum over a limited-data-rate signal path, comprising the steps of:

dividing said information into intervals:

providing memorized frequency spectra identifiable by codewords of the same bit size;

for each of said intervals, comparing the frequency spectrum of said information with said memorized frequency spectra, for selecting one of said codewords which represents that one memorized frequency spectrum which most closely represents the frequency spectrum of said information, to thereby form a selected codeword representative of a single interval;

for each of a first plurality of said intervals taken as a set, comparing said frequency spectrum of said information in said set with said memorized frequency spectra, for selecting one of said codewords which represents that one memorized frequency spectrum which most closely represents the frequency spectrum of said information in said first plurality of intervals taken as the set, to thereby form a selected codeword representative of first plural intervals;

placing at least some of said selected codewords in a first-in, first-out buffer;

reading said codewords from said buffer at a predetermined bit rate;

monitoring the ullage of said buffer, and, in said placing step, (a) tending to place in said buffer those of said selected codewords representative of plural intervals when said buffer tends to be full, and (b) tending to place in said buffer those of said selected codewords representative of a single interval when said buffer tends to be empty, whereby said buffer tends not to overflow or empty.

2. A method according to claim 1, wherein said information is speech.

3. A method according to claim 1, wherein said step of dividing said information into intervals includes the step of dividing said information into nonoverlapping intervals.

4. A method according to claim 1, wherein said step of dividing said information into intervals includes the step of dividing said information into nonoverlapping sequential intervals.

5. A method according to claim 1, wherein said step of providing memorized frequency spectra includes the step of providing memorized frequency spectra identifiable by codewords having equal bit lengths.

6. A method according to claim 1, wherein said step of providing memorized frequency spectra identifiable by codewords includes the step of providing memorized line frequency spectra identifiable by codewords.

7. A method according to claim 1, wherein said step of providing memorized frequency spectra identifiable by codewords comprises the steps of:

providing first memorized frequency spectra identifiable by codes;

providing second memorized frequency spectra identifiable by codes; and wherein said step of, for each of said intervals, comparing said frequency spectrum, comprises the steps of;

comparing a first portion of said frequency spectrum of said information with said first set of memorized frequency spectra identifiable by code, for selecting that one of said codes of said first set which most closely represents said frequency spectrum of said first portion of said information;

comparing a second portion of said frequency spectrum of said information with said second set of memorized frequency spectra identifiable by codes, for selecting that one of said codes of said second set which most closely represents said frequency spectrum of said second portion of said information; and combining said selected ones of said codes of each of said first and second memorized frequency spectra to form said codeword.

8. A method according to claim 1, wherein said step of comparing said frequency spectrum of said information in said set with memorized frequency spectra, includes the step of comparing said frequency spectrum of said information in a set of three of said intervals.

9. A method according to claim 1, further comprising the step of:

for each of a second plurality of said intervals taken as a set, comparing said frequency spectrum of said information in said set with memorized frequency spectra, for selecting one of said codewords which represents the memorized frequency spectrum which most closely represents said frequency spectrum of said information in said second plurality of intervals taken as a set, to thereby produce from selected codewords representative of a second plurality of intervals.

10. A method according to claim 1, wherein said step of monitoring the ullage of said buffer comprises the step of monitoring the rate at which data flows into said buffer, and comparing said rate with said predetermined rate to produce a fill rate control threshold signal.

11. A method according to claim 10, wherein said fill rate control threshold signal controls said placing step in such a manner as to tend to place said codewords representative of plural intervals when said rate at which data flows into said buffer exceeds said predetermined rate and as to tend to place said codewords representative of a single interval when said rate at which data flows into said buffer is less than said predetermined rate.

12. A method according to claim 11, wherein said placing step includes the step of comparing the distortion of said codeword representative of a single interval with the sum of said threshold signal with the quotient of the distortion of said codeword representative of plural intervals, divided by the number of intervals in said plural intervals to thereby determine that codeword which is the best distortion/time compromise codeword, and placing said best distortion/time compromise codeword.

13. A method for transmitting information with a fluctuating frequency spectrum over a limited-data-rate signal path, comprising the steps of: dividing said information into intervals: providing memorized frequency spectra identifiable by codewords of the same bit size;

for each of said intervals, comparing the frequency spectrum of said information with said memorized frequency spectra, for selecting one of said codewords which represents that one memorized frequency spectrum which most closely represents the frequency spectrum of said information, to thereby form a selected codeword representative of a single interval;

for each of a number of said intervals taken as a set, which number is less than said first plurality of said intervals, comparing said frequency spectrum of said information in said set with said memorized frequency spectra, for selecting one of said codewords which represents that one memorized frequency spectrum which most closely represents said frequency spectrum of said information in said set, to thereby form a selected codeword representative of a number of intervals;

placing at least some of said codewords in a buffer;

reading codewords from said buffer at a predetermined rate onto said signal path;

in conjunction with said placing step, choosing for placement in said buffer, from among said selected codewords, those codewords which, when placed in said buffer, result in an average data rate equal to said predetermined rate, and which, for said average data rate, provide the least distortion of said information.

14. A method according to claim 13, wherein said step of comparing said frequency spectrum of said set including a number of intervals includes the step of comparing said frequency spectrum of one interval taken as a set.

15. A method according to claim 13, wherein said step of choosing for placement in said buffer that one of said selected codewords which represents the shortest set for which the distortion of said codeword, divided by the number of said intervals represented by said shortest-set codeword, is less than the sum of a threshold plus the quotient of the distortion of each codeword representing a larger number of said intervals, divided by said larger number of intervals.

16. A method according to claim 15, wherein said step of choosing for placement includes the step of selecting the magnitude of said threshold in response to the ullage of said buffer.

17. A method according to claim 15 wherein said step of choosing for placement includes the steps of:

selecting, for placement in said buffer, that current codeword representing the smallest number of said intervals, when said buffer is determined to be nearly empty; and selecting, for placement in said buffer, that current codeword representing the largest number of said intervals, when said buffer is determined to be nearly full.

* * * * *